United States Patent [19]

Haruta et al.

[11] Patent Number: 5,544,773
[45] Date of Patent: Aug. 13, 1996

[54] METHOD FOR MAKING MULTILAYER PRINTED CIRCUIT BOARD HAVING BLIND HOLES AND RESIN-COATED COPPER FOIL USED FOR THE METHOD

[76] Inventors: Youichi Haruta, 2-13, Tachibanacho, Kuwana-shi, MIE 511; Tomio Kambayashi, 5-813, Uedayama, Tempaku-ku, Nagoya-shi, Aichi 468; Hitoshi Kato, Espoir Toyoake II-103, 2-1, Yoshiike, Shindencho, Toyoake-shi, Aichi 470-11; Hiromu Taguchi, Southern Hill Yagoto 1-804, 47-147, Takigawacho, Showa-ku, Nagoya-shi, Aichi 466, all of Japan

[21] Appl. No.: 252,928

[22] Filed: Jun. 2, 1994

Related U.S. Application Data

[62] Division of Ser. No. 937,592, Aug. 31, 1992, abandoned.

[30] Foreign Application Priority Data

| Sep. 6, 1991 | [JP] | Japan | 3-254261 |
| Mar. 13, 1992 | [JP] | Japan | 4-88395 |
| Apr. 6, 1992 | [JP] | Japan | 4-112304 |

[51] Int. Cl.⁶ .................................................. C23F 1/00
[52] U.S. Cl. ............................................. 216/13; 216/105
[58] Field of Search .................................. 156/666, 668, 156/630; 428/901; 427/96, 97; 29/829; 216/105, 13

[56] References Cited

U.S. PATENT DOCUMENTS

| 4,501,689 | 2/1985 | Yanagawa | 252/600 |
| 4,597,988 | 7/1986 | Kukanskis et al. | 156/668 |
| 4,601,783 | 7/1986 | Krulik et al. | 216/13 |
| 4,642,160 | 2/1987 | Burgess | 156/630 |
| 4,722,959 | 2/1988 | Inoue et al. | 524/412 |
| 4,775,444 | 10/1988 | Cordani | 156/666 |
| 4,915,983 | 4/1990 | Lake et al. | 427/98 |
| 4,978,422 | 12/1990 | Letize et al. | 216/13 |
| 4,988,605 | 1/1991 | Kubota et al. | 430/270 |
| 5,009,982 | 4/1991 | Komayachi et al. | 430/280 |
| 5,017,271 | 5/1991 | Whelwell et al. | 427/98 |
| 5,347,712 | 9/1994 | Yosuda et al. | 427/97 |

FOREIGN PATENT DOCUMENTS

| 59-213196 | 12/1984 | Japan . |
| 3160784 | 7/1991 | Japan . |

OTHER PUBLICATIONS

Clyde F. Coombs, "Printed Circuits Handbook", 3rd Edition, 1988, pp. 11.1–11.37, 32.2.

Primary Examiner—George E. Forson
Assistant Examiner—Thomas G. Bilodeau

[57] ABSTRACT

Provided is a method for making a multilayer printed circuit board having blind holes which comprises heat laminating a copper foil and an inner layer panel previously provided with circuit patterns on one or both sides thereof by processing a copper-clad laminate, a resin layer soluble in an aqueous alkali solution and having a flowability upon heating being present between said copper foil and said inner layer panel, forming via holes in the surface copper foil by etching and then dissolving the resin layer under said via holes with an aqueous alkali solution and removing the resin layer, thereby to form blind holes in which the copper foil on the inner layer panel is exposed. Further provided is a copper foil used for making multilayer printed circuit boards, which is provided with a resin layer soluble in an aqueous alkali solution and having flowability upon heating on its roughened surface.

9 Claims, 6 Drawing Sheets

5,544,773

METHOD FOR MAKING MULTILAYER PRINTED CIRCUIT BOARD HAVING BLIND HOLES AND RESIN-COATED COPPER FOIL USED FOR THE METHOD

The application is a divisional application of Ser. No. 07/937,592 filed: Aug. 31, 1992, now abondoned.

The present invention relates to a method for making multilayer printed circuit boards which are suitable for high density assembly and more particularly it relates to a method for making excellent multilayer circuit boards having blind via holes which is excellent in mass productivity. It also relates to copper foils coated with resins, which are utilized for the above method.

At present, printed circuit boards are assembled in increasingly higher density with miniaturization in size and diversification in functions of electronic equipments. For example, conductor circuits are made finer and increased in the number of layers, through-holes including interstitial via holes such as through via holes, blind via holes and buried via holes are reduced in diameter and high density assembly is made by mounting small chip parts on the surface.

For explanation of conventional methods for making multilayer circuit boards having blind via holes, schematic sectional views of respective steps are shown in accompanying FIGS. 10–17. Inner layer panel 7 on which copper circuit patterns 6 are previously formed by etching method is prepared and the inner layer panel 7 and outer layer copper foils 1 are laid-Up with one or two sheets of prepreg 5 being put therebetween as shown in FIG. 10 and the assembly is hot pressed to obtain a copper-clad laminate panel having inner layer circuit patterns as shown in FIG. 11.

Then, blind via holes 13 are formed at given positions by a drill machine as shown in FIG. 12 Successively, conventional through-hole 10 is formed as shown in FIG. 13.

Subsequently, this panel is subjected to conventional electroless copper plating and electrolytic copper plating to form plated through-hole 11 as shown in FIG. 14 and then etching resist 12 is formed (FIG. 15) and the panel is subjected to etching to obtain the result as shown in FIG. 16. Finally, the etching resist film is removed to obtain a multilayer printed circuit board having blind via holes as shown in FIG. 17.

In order to form blind via holes by a drill in this way, they cannot be formed through a plurality of stacked panels as made when usual through-holes are formed and the blind via holes must be formed in every one panel. Therefore, a very long time is required for formation of holes and productivity is inferior. Furthermore, for controlling the depth of the drill tip in formation of holes by drill, it is necessary that moving distance of the drill tip in the drilling direction, generally in the direction of Z axis, is identical with the depth of the copper circuit pattern on the surface of the inner layer panel. However, a drill for forming a hole of small diameter such as 0.1–0.5 mm causes much run-out and there is variation in position of copper circuit pattern in the direction of Z axis and thus it is difficult to accurately control the drilling. If the depth of drilling is shallow, the drill does not reach any underneath copper circuit pattern and the pattern is not connected with the subsequent copper plating to cause failure in formation of blind via holes and if drilling is too deep, the hole sometimes contacts another underneath copper foil pattern to cause failure by short circuit.

Furthermore, irrespective of presence or absence of blind via holes, when a prepreg is used as insulating layer between the inner layer panel and the surface copper foil in multilayer printed circuit boards, such multilayer printed circuit boards have the defect of increasing in thickness. Besides, in general, multilayer printed circuit boards are insufficient in adhesion between the insulating layer and the surface copper foil, dielectric strength and surface insulation resistance and these are troubles in formation of the surface copper foil into fine patterns.

SUMMARY OF THE INVENTION

The object of the present invention is to overcome the defects in the conventional methods and provide a method for making multilayer printed circuit boards having blind via holes which are stable in quality and excellent in mass productivity and resin-coated copper foils which are used for making the same.

The present invention relates to a method for making excellent multilayer printed circuit boards having blind holes and copper foils with resins used for the method. The invention is characterized in laminating an inner layer panel and a copper foil which is generally roughened in its surface, between which a resin layer soluble in an alkali solution and having flowability upon heating is put and besides, in using the copper foil coated with the resin for making the multilayer printed circuit boards having blind holes.

Figure 1:
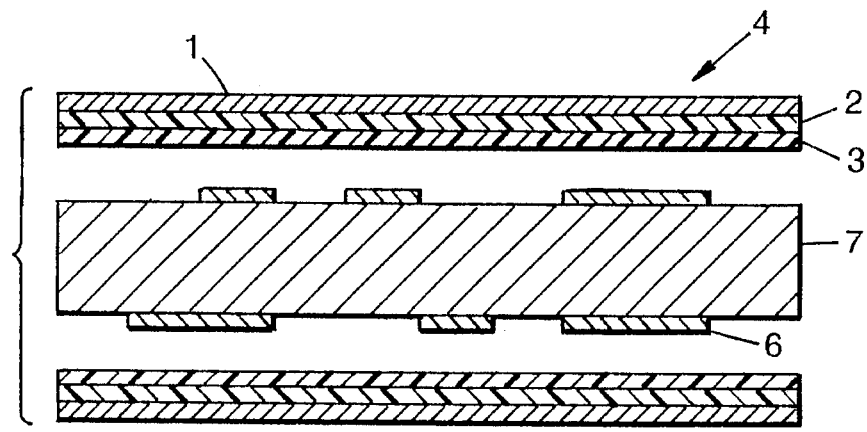
FIG. 1 is a schematic sectional view which shows constructions of an inner layer panel having copper circuit patterns on its surface and a copper-clad insulating sheet before they are heat pressed for lamination in the process of production of multilayer printed circuit board having via holes by using copper-clad insulating sheet according to the present invention (Example 1).

In the above FIGS. 1–22, referential numeral 1 denotes copper foil; 2, first resin layer; 3, second resin layer; 4, copper-clad insulating sheet; 5, prepreg; 6, conductor pattern; 7, inner layer panel; 8, via hole of cooper foil; 9, blind via hole; 10, through-hole; 11, plated through-holes; 12, etching resist; 13, spacer; 14, metal roller; 15, positive type etching resist; and 16, conductive paste.

As the resins soluble in aqueous alkali solution and having flowability upon heating (hereinafter referred to as "alkali soluble resin"), there may be used non-photosensitive resins containing alkali-soluble groups such as carboxyl group and phenolic hydroxyl group and photo-sensitive resins containing alkali-soluble groups such as carboxyl group and phenolic hydroxyl group and photopoly-merizable or photodimerizable photosensitive groups such as (meth)acryloyl groups, internal olefins, azide group and cinnamate residue.

Examples of the non-photosensitive resins are as follows.

① Copolymers of (meth)acrylic acids and vinyl monomers such as (meth)acrylates and styrene.

② Half esters comprising copolymers of styrene and maleic anydride to which alcohols are added, for example, SMA1440, SMA17352, SMA2625 and SMA3840 manufactured by Atochem Co. and SCRIPSET540 and SCRIPSET550 manufactured by Monsanto Co.

③ Copolymers of styrene and p-hydroxyphenylmaleimide.

④ Polyvinylphenols or copolymers thereof, for example, Marinkary M and Marinkary MB manufactured by Maruzen Oil Co., Ltd., methyl methacrylate copolymers, hydroxyethyl methacrylate copolymers, styrene copolymers and phenyl-maleimide copolymers.

⑤ Novolak type phenolic resins and novolak type cresol resins.

⑥ Ring-opening adducts of alcoholic hydroxyl group-containing polymers with acid anhydrides.

Polyfunctional monomers can be combined with these resins for imparting photosensitivity thereto.

Examples of the photosensitive resins are as follows.

① Ring-opening adducts of epoxy (meth)acrylates with acid anydrides.

② Half esters comprising copolymers of styrene with maleic anhydrides to which unsaturated alcohols are added.

③ Ring-opening adducts of glycidyl methacrylate and polymers such as copolymers of (meth)acrylic acids and vinyl monomers such as (meth)acrylates and styrene, half esters comprising copolymers of styrene and maleic anhydride to which alcohols are added, copolymers of styrene and p-hydroxyphenylmaleimide, polyvinylphenols or copolymers thereof, novolak type phenolic resins, novolak type cresol resins, and ring-openig adducts of alcoholic hydroxyl group-containign polymers with acid anhydrides.

④ Products obtained by condensation of a part of hydorxyl group in phenolic hydroxyl group-containing polymers such as copolymers of styrene and p-hydroxyphenyl-maleimide, polyvinylphenols and copolymers thereof, novolak type phenolic resins and novolak type cresol resin with photosensitive group-containing acid chlorides such as (meth)acrylic acid chlorides and cinnamic acid chloride.

⑤ Products obtained by condensation of a part of hydroxyl groups of alcoholic hydroxyl group-containing polymers with photosensitive group-containing acid chlorides such as (meth)acrylic acid chlorides and cinnamic acid chloride and by ring-opening addition of acid anhydrides to the remainder hydroxyl groups.

⑥ Products obtained by addition of isocyanate group-containig (meth)acrylates to a part of hydroxyl groups of alcoholic hydroxyl group-containing polymers and ring-opening addition of acid anhydrides to the remainder hydroxyl groups.

⑦ Products obtained by addition of isocyanate group-containig (meth)acrylates to a part of hydroxyl groups in phenolic hydroxyl group-containing polymers such as copolymers of styrene and p-hydroyphenylmaleimide, polyvinylphenol or copolymers thereof, novolak type phenolic resins and novolak type cresol resins.

⑧ Products obtained by addition of isocyanate group-containig (meth)acrylates to a part of hydroxyl groups of epoxy (meth)acrylates and ring-opening addition of acid anhydrides to all or a part of the remainder hydroxyl groups.

Examples of the processes for producing the above resins are as follows.

For example, half esters comprising copolymers of styrene and maleic anhydride to which unsaturated alcohols are added can be obtained by addition reaction of copolymers of styrene and maleic anhydride such as SMA1000, SMA2000 and SMA3000 manufactured by Atochem Co. and SCRIPSET520 manufactured by Monsanto Co. with unsaturated alcohols such as hydroxyethyl acrylate and hydroxyethyl methacrylate.

Ring-opening adducts of glycidyl methacrylate and polymers such as copolymers of (meth)acrylic acids and vinyl monomers such as (meth)acrylates and styrene; half esters comprising copolymers of styrene and maleic anhydride to which alcohols are added; copolymers of styrene and p-hydroxyphenylmalemide; polyrvinylphenol or copolymers thereof; novolak type phenolic resins; novolak type cresol resins; and ring-opening adducts of alcoholic hydroxyl group-containing polymers and acid anhydrides can be obtained by dissolving the polymers in solvents, e.g., ethers such as diglyme, esters such as ethylcarbitol acetate, ethylcellosolve acetate and isopropyl acetate, and ketones such as methyl ethyl ketone and cyclohexanone and allowing the polymers to react with glycidyl methacrylate in the presence of 10 to 10,000 ppm, preferably 30 to 5,000 ppm, more preferably 50 to 2,000 ppm of radical polymerization inhibitors such as hydroquinone, hydroquinone monomethyl ether and phenothiazien at a temperature in the range of from room temperature to 170° C., preferably 40° to 150° C., more preferably 60° to 130° C., while the glycidyl methacrylate is or diluted with solvents and is being dropped to the polymers. In this case, it is preferred to add quaternary ammonium salts such as tetrabutylammonium bromide and trimethylbenzylammonium chloride or tertiary amines such as triethylamine as catalysts.

In case of ring-opening addition of epoxy group of glycidyl methacrylate to alkali soluble groups such as carboxyl group and phenolic hydroxyl group in the polymers, if the reaction is carried out so as to obtain suitable acid value by leaving a part of the alkali soluble groups, the products can be used for the present invention as they are. If acid value becomes too low and alkali solubility decreases, further ring-opening addition of acid anhydrides to secondary hydroxyl groups produced by the above reaction may be effected to increase acid value and improve solubility and thus, the products can also be used for the present invention.

Condensates of a part of hydroxyl groups in phenolic hydroxyl group-containing polymers such as copolymers of styrene and p-hydroxyphenylmaleimide, polyvinylphenols and copolymers thereof, novolak type phenolic resins and novolak type cresol resins with photosensitive group-containing acid chlorides such as (meth)acrylic acid chloride and cinnamic acid chloride can be obtained by dissolving the polymers in solvents, e.g., water-immiscible solvents such as methylene chloride, chloroform and toluene and water-miscible solvents such as acetone, diglyme and ethylcarbitol acetate, adding thereto bases such as potassium hydroxide, calcium hydroxide and triethylamine, adding thereto photosensitive group-containing acid chlorides and carrying out reaction usually at 0° to 100° C., preferably 0° to 50° C., more preferably 0° to 030° C. Quaternary ammonium salts, tertiary amines, phosphate esters, phosphite esters and the like are used as catalysts. When solvents immiscible with water and inorganic bases are used, water may be added to the system to terminate the reaction in a shorter time. When solvents immiscible with water are used, purification can be carried out by washing the reaction mixtures with acidic aqueous solutions, repeatedly washing the reaction mixtures with water, dehydrating and filtering the reaction mixtures to carry out desolvation. If necessary, purification by reprecipitation may further be carried out. When solvents miscible with water are used, the reaction mixtures are mixed with a suitable amount of water to precipitate products as solids. The products are repeatedly washed with water and then dried. In condensation of phenolic hydroxyl groups which are alkali soluble groups in the polymers with acid chloride groups, a part of the alkali soluble groups are left to obtain a suitable acid value.

Products obtained by addition of isocyanate group-containing (meth)acrylates to a part of hydroxyl groups of alcoholic hydroxyl group-containing polymers and ring-opening addition of acid anhydrides to the remainder hydroxyl groups can be obtained by adding hydroxyl group-containing (meth)acrylates such as hydroxyethyl acrylate and hydroxyethyl methacrylate to one of isocyanate groups of diisocyanates, preferably compounds such as isophorone diisocyanate which have two isocyanate groups differing in reactivity. Standard conditions are that tin compounds such as dibutyltin dilaurate are used as catalysts and reaction is carried out at about 60° to 80° C.

The alkali soluble resins used in the present invention have an acid value in the range of preferably 0.2 to 10.0 meq/g, more preferably 0.4 to 5.0 meq/g, especially preferably 0.6 to 1.0 meq/g. If the acid value is too low, alkali solubility lowers and if it is too high, water resistance is inferior.

Molecular weight (weight-average molecular weight in terms of styrene measured by gel permeation chromatography) of the alkali soluble resins is preferably in the range of 1,000 to 200,000, more preferably 2,000 to 100,000, especially preferably 3,000 to 50,000. If the molecular weight is too small, heat resistance and water resistance are inferior and flowability is too high. If it is too large, alkali solubility lowers.

The alkali soluble resins used in the present invention preferably have photosensitivity. Concentration of the photosensitive groups is preferably in the range of 0.1 to 10.0 meq/g, more preferably in the range of 0.3 to 8.0 meq/g, especially. preferably if the range of 0.5 to 5.0 meq/g. If concentration of the photosensitive groups is too low, photocurability is inferior and if it is too high, storage stability is low.

As the alkali soluble resins used in the present invention, there may be used various ones as mentioned above each alone or in combination. Preferred are novolak type epoxy acrylates and methacrylates (hereinafter referred to as "(meth)acrylates") having carboxyl group. These are excellent in heat resistance and electric properties and can be readily cured by means of irradiation with active energy rays such as electron rays and ultraviolet rays, heating and the like.

The novolak type epoxy (meth)acrylates having carboxyl group are obtained by adding acrylic acid or methacrylic acid to 90% or more of epoxy groups of phenol novolak type epoxy or cresol novolak type epoxy and adding acid anhydrides to the hydroxyl groups produced.

As the phenol novolak type epoxy or cresol novolak type epoxy of starting materials, it is desirable to use those which have a weight-average molecular weight of preferably 1000 or more, more preferably 3000 or more, especially preferably 4000 or more. If it is less than 1000, cross linking density of the resulting resins is low and electric properties and drying properties are inferior and they are not preferred for the present invention. As the acid anhydrides used, preferred are succinic anhydride, tetrahydrophthalic anhydride and trimellitic anhydride which are excellent in solubility in solvents or aqueous alkali solutions and phthalic anhydride, hexahydrophthalic anhydride and maleic anhydride may also be used. It is preferred to use acid anhydrides in an amount of 0.2 to 0.95 equivalent of epoxy group before reaction.

If it is less than 0.2 equivalent, it dissolves in aqueous alkali solutions with difficulty and if more than 0.95 equivalent, unreacted acid anhydrides remain and hence properties of resin layer such as heat resistance and electric properties deteriorate.

Charging amounts of the epoxy and the (meth)acrylic acid is such that amount of (meth)acrylic acid is preferably in the range of 0.98 to 1.10 equivalent, more preferably in the range of 1.00 to 1.07 equivalent, especially preferably 1.01 to 1.04 equivalent per epoxy group. If charging amount of (meth)acrylic acid is small, epoxy groups remain to cause deterioration of storage stability of the resulting resin and in extreme case, the resin gels in modification with acid anhydrides. If it is too large, (meth)acrylic acid remains to cause emission of an offensive smell or deterioration of heat resistance.

It is effective to add 30 to 300 ppm of hydroquinone as a radical polymerization inhibitor in ring-opening addition reaction of epoxy (meth)acrylate with acid anhydrides. When about 500 ppm of phenothiazine is added, synthesis of the resin is also possible, but the resin is somewhat inferior in storage stability to the resin produced with hydroquinone. Radical polymerization inhibiting effect may be sometimes enhanced when the reaction is conducted with blowing air, 5% oxygen-containing nitrogen or the like into reaction mixture.

In the ring-opening addition reaction of epoxy (meth)acrylate with acid anhydrides, preferably 0.1 to 5.0%, more preferably 0.3 to 2.0% of quaternary ammonium salts such as tetrabutylammonium bromide are used as catalysts. If amount of the catalysts is small, reaction proceeds slowly and if amount is too large, catalysts remain in the reaction products to deteriorate insulation property.

Of these acid anhydrides, succinic anhydride, tetrahydrophthalic anhydride, trimellitic anhydride and methylhexahydrophthalic anhydride are superior in alkali solubility and can be dissolved with sodium carbonate, but phthalic anhydride, itaconic anhydride and maleic anhydride can hardly be dissolved with sodium carbonate and hence, sodium hydroxide must be used.

In the ring-opening addition reaction of epoxy (meth)acrylate with acid anhydrides, there may be used, as preferred solvents, those which sufficiently dissolve the starting materials and the reaction products, have a boiling point higher than reaction temperature and contain no hydroxyl group. Use of solvents having hydroxyl group such as butyl cellosolve should be avoided because they react with acid anhydrides and sometimes give by-products which deteriorate heat resistance. As preferred solvents, mention may be made of ethers such as diglyme, esters such as ethylcarbitol acetate, ethyl cellosolve acetate and isopropyl acetate and ketones such as methyl ethyl ketone and cyclohexanone. Aromatic hydrocarbons may be used in combination with the above solvents in such an amount that they do not damage the solubility of reaction products.

The ring-opening addition reaction of epoxy (meth)acrylate with acid anhydrides is carried out at a temperature in the range of preferably 60° to 160° C., more preferably 70° to 140° C., especially preferably 80° to 120° C. If the reaction temperature is too low, reaction speed is slow and if it is too high, the reaction product gels or storage stability deteriorates.

The reaction of (meth)acrylation is completed when acid value of reaction mixture continuously analyzed becomes nearly zero. Reaction time greatly varies depending on reaction temperature and catalyst concentration, but is normally 4 to 30 hours. Reaction time for acid anhydride modification is normally 1 to 8 hours.

As mentioned above, the synthesis of novolak type epoxy (meth)acrylate having carboxyl group comprises two stage reactions. In the first stage reaction, epoxy resin and (meth)acrylic acid are bonded through ester bond by the reaction between epoxy group of the epoxy resin and carboxyl group of the (meth)acrylic acid and simultaneously secondary hydroxyl group is produced. This reaction involves generation of heat. In the second stage reaction, the previously produced secondary hydroxyl group reacts with acid anhydride to result in ester bond and simultaneously carboxyl group is produced. This reaction involves generation of some heat.

In the present invention, the alkali soluble resins are used in the form of compositions together with resins for improvement of properties such as adhesion, fillers, curing agents and, if necessary, solvents. For the present invention, the alkali soluble resins which have active energy ray curability are preferred and if they have no active energy ray curability, it is preferred to use in combination various active energy ray curable (meth)acrylic resins or oligomers such as of urethane acrylic type and epoxy acrylic type to impart active energy ray curability to the compositions and then add reaction initiators and reaction sensitizers for curing with active energy rays.

Furthermore, there may be optionally added coloration pigments, extender pigments, antifoamers, leveling agents, thixotropic agents, polymerization inhibitors and anti-settling agents to the above resin compositions.

The resins used in the alkali soluble resins for improvement of adhesion include photoreactive oligomers and thermosetting resins.

As the photoreactive oligomers, there may be used polyether type, polyester type, unsaturated polyester type, urethane type, epoxy type, polyester/urethane type, polyacetal type and polybutadiene type oligomers. Examples of monofunctional oligomers are 2-ethylhexyl acrylate, 2-hydroxyethyl acrylate and 2-hydroxypropyl acrylate. Examples of bifunctional oligomers are urethane acrylate, 1,3-butanediol diacrylate, 1,4-butanediol diacrylate, 1,6-hexanediol diacrylate, diethylene glycol diacrylate, neopentyl glycol diacrylate and polyethylene glycol 400 diacrylate and hydroxypivalic acid ester neopentyl glycol diacrylate. Examples of polyfunctional oligomers are trimethylolpropane triacrylate, pentaerythritol triacrylate, dipentaerythritol hexaacrylate and triallyl isocyanurate. The thermosetting resins include acrylic resins, urethane resins, epoxy resins, polyester resins, polyether resins, alkyd resins, fluoro resins, silicone resins, vinyl acetate resins and polyvinyl alcohols.

Urethane acrylates and brominated carbonate oligomers are especially preferred as the resins added to the alkali soluble resins to improve their properties.

The urethane acrylates have especially an action to enhance adhesion between surface copper foil and resin layer. Non-yellowing and medium hardness type urethane acrylates are preferred as the acrylates and Aronix M-1100, Aronix M-1600, Aronix M-1700 and the like manufactured by Toagosei Chemical Industry Co., Ltd. are preferably used each alone or as mixtures. The acrylates are used preferably in an amount of 20° to 120 parts by weight for 100 parts by weight of the alkali soluble resins. If the amount is more than 120 parts by weight, solubility of compositions with aqueous alkali solution deteriorates and resin residues may be produced. If there are resin residues in electrically connecting conductor patterns of inner layer panels with surface copper foils, sometimes sufficient connection cannot be obtained. If it is less than 20 parts by weight, adhesion strength between the surface copper foil and the resin layer cannot be sufficiently improved.

Brominated carbonate oligomers have effect on flame retardancy properties. As the oligomers, there may be used, for example, Fireguard 7000, Fireguard 7500, Fireguard 8100 which has been identified by its manufactured as a carbonate oligomer and Fireguard 8500 manufactured by Teijin Kasei Co. and these are used preferably in an amount of 20 to 60 parts by weight per 100 parts by weight of the alkali soluble resins. If the amount exceeds 60 parts by weight, dielectric strength between conductor patterns and surface copper foils is deteriorated and if it is less than 20 parts by weight, flame retardance of resin layer is insufficient and besides, adhesion to copper foil is not improved.

As the fillers, there may be used talc, barium sulfate and clay each alone or as mixtures and besides, these fillers to which a small amount of Aerosil is added may be used, but calcined clay treated with silane coupling agent is preferred because it provides high adhesion strength to copper foil and has high insulation resistance. Amount of fillers is preferably 20 to 200 parts by weight per 100 parts by weight of the alkali soluble resins. If it is less than 20 parts by weight, the alkali soluble resin flows too much when inner layer panel and copper foil sandwitching the resin are pressed or laminated and thickness of the resin layer between the copper foil of inner layer and the surface copper foil cannot be ensured and insulation is deteriorated. If it is more than 200 parts by weight, flowability is inferior in coating on the inner layer panel and the copper foil and besides, dissolution in formation of blind holes becomes difficult.

Peroxide curing agents can be used and alkyl peroxides or aryl peroxides such as dibutyl peroxide, butylcumyl peroxide and dicumyl peroxide are preferred from the point of storage stability. Amount of the curing agents is preferably 1 to 10 parts by weight per 100 parts by weight of alkali soluble resins. If it is less than 1 part by weight, curing time is long and if it is more than 10 parts by weight, shelf life is shortened and operability is deteriorated. The curing agents are not necessarily needed in the case of carrying out irradiation with ultraviolet rays or electron rays, but it is preferred to add them order to increase adhesion stability and soldering heat resistance.

As solvents, preferred are ethylcarbitol acetate, ethylcellosolve acetate, diethylene glycol dimethyl ether, butyl cellosolve acetate and the like because they have high boiling points and screen printing can be easily performed. Amount of the solvents is preferably 10 to 200 parts by weight per 100 parts by weight of alkali soluble resins. If it is more than 200 parts by weight, coating thickness on copper foil or inner layer panel is insufficient. If it is less than 10 parts by weight, flowability necessary for coating on copper foil or inner layer panel can be obtained with difficulty.

When the resin composition is coated with roll coater, bar coater, curtain coater and the like, low-boiling organic solvents such as methyl ethyl ketone, ethyl acetate and toluene are used because they can be easily removed from the resin composition by drying after coating.

As reaction initiators for curing with active energy rays such as ultraviolet rays and electron rays, mention may be made of benzyl, benzoin, benzoin alkyl ether and 1-hydroxycyclohexylphenyl ketone as benzoin ether type; benzyldialkyl ketal as ketal type; 2,2'-dialkoxyacetophenone, 2-hydroxyacetophenone, p-t-butyltrichloroacetophenone and p-t-butyldichloroacetophenone as acetophenone type; benzophenone, 4-chlorobenzophenone, 4,4'-dichlorobenzophenone, 4,4'-bisdimethylaminobenzophenone, methyl o-benzoylbenzoate, 3,3'-dimethyl-4-methoxybenzophenone, 4-benzoyl-4'-methyldiphenyl sulfide, dibenzosuberone and benzimethyl ketal as benzophenone type; and thioxanthone, 2-chlorothioxanthone, 2-alkylthioxanthone, 2,4-dialkylthioxanthone, 2-alkylanthraquinone and 2,2'-dichloro-4-phenoxyacetone as thioxanthone type. As commercially available curing initiators, for example, Irgacure 907 manufactured by Ciba-Geigy Co. may be used. Amount of the initiators is preferably in the range of 0.5 to 10 parts by weight per 100 parts by weight of alkali soluble resins. If the amount is less than 0.5 part by weight, the reaction is not sufficiently initiated and if it is more than 10 parts by weight, resin layer becomes brittle. When irradiation with electron rays is carried out, the reaction initiators are not necessarily needed.

Sensitizers used for curing reaction by active energy rays such as ultraviolet rays and electron rays includes, for example, Nissocure EPA, EMA, IAMA, EHMA, MABP and EABP manufactured by Shin Nisso Kako Co., Kayacure EPA, DETX and DMBI manufactured by Nippon Kayaku Co., Ltd., Quntacure EPD, BEA, EOB and DMB manufactured by Ward Blenkinsop Co., DABA manufactured by Osaka Yuki Co., PAA and DAA manufactured by Daito Kagaku Co., and Kayacure EPA and Kayacure DETX manufactured by Nippon Kayaku Co.,Ltd. Amount of the sensitizers is preferably in the range of 0.5 to 10 parts by weight per 100 parts by weight of alkali soluble resins. If is is less than 0.5 part by weight, reaction rate of curing with active energy rays is not accelerated and if it is more than 10 parts by weight, the reaction rate is high to cause deterioration of shelf life. In the case of irradiation with electron rays, the reaction sensitizers are not necessarily needed.

As mentioned above, the resin layer soluble in aqueous alkali solution and having flowability upon heating used in the present invention can be prepared from a resin composition which comprises 100 parts by weight of alkali soluble resin, especially novolak type epoxy acrylate having carboxyl group, 10 to 200 parts by weight of solvent, 20–200 parts by weight of filler and 1 to 10 parts by weight of peroxide as curing agent and optionally, urethane acrylate or brominated carbonate oligomer may be added thereto. Besides, for curing with active energy rays, 0.5 to 10 parts by weight of reaction initiator and 0.5 to 10 parts by weight of sensitizer are added. Preferably, the resin layer consists of two layers different in flowability under heating. Flowability of the layers can be varied, for example, by adding fillers to resins, by controlling addition amount of fillers or molecular weight of resins or by varying type of resins.

When the resin layer comprising two layers is provided so that the layer containing filler and low in flowability upon heating is continuous to the surface of copper foil and the layer containing no or small amount of filler and high in flowability upon heating is continuous to the surface of inner layer panel, in heating, namely, at about 60° to 80° C. at the step of heat laminating of the whole assembly by pressing or lamination, the resin of the resin layer high in flowability at heating flows out between conductor patterns of inner layer panel and to the surface of the inner layer panel to completely fill the space and on the other hand, the resin of the resin layer low in flowability at heating is small in flow at heating and hence it ensures the thickness of insulating layer between the conductor pattern and the copper foil and makes constant the thickness of resin layer between copper circuit pattern on the surface of inner layer panel and copper foil of the outer layer. As a result, high quality multilayer printed circuit boards which maintain insulation can be produced.

That is, it is preferred to make two-layer structure consisting of a second layer comprising a resin composition mainly composed of alkali soluble resin and curing agent and a first layer comprising said resin composition to which filler is added. More specifically, the second resin layer comprises a resin composition mainly composed of 100 parts by weight of novolak type epoxy (meth)acrylate having carboxyl group, and 1 to 10 parts by weight of curing agent and the first resin layer comprises a resin composition mainly composed of 100 parts by weight of novolak type epoxy (meth)acrylate having carboxyl group, 20 to 200 parts by weight of filler, and 1 to 10 parts by weight of curing agent. These resin layers may optionally contain 20 to 120 parts by weight of urethane acrylate, 20 to 60 parts by weight of brominated carbonate oligomer, 0.5 to 10 parts by weight of initiator for curing reaction with active energy rays, and 0.5 to 10 parts by weight of sensitizer for curing reaction with active energy rays. This is one example of the resin layer of the present invention.

B-staged resin compositions mainly composed of epoxy resin used for conventional prepregs for laminate sheets can be used as the second resin layer soluble in aqueous alkali solution and high in flowability upon heating. However, when inner layer panel and resin layers having copper foil are pressed or laminated, in some case, the pressure is unevenly applied due to influence by the shape of copper foil pattern on the inner layer panel and the second layer does not completely flow out from the copper foil and remains on the copper foil and in this case, the second resin layer comprising B-staged epoxy resin may not be dissolved with aqueous alkali solution. On the other hand, when the resin composition comprises novolak type epoxy (meth)acrylate having carboxyl group as polymer base, this composition is soluble in aqueous alkali solution and so, the above problem does not occur. Therefore, resin composition mainly composed of the novolak type epoxy (meth)acrylate having carboxyl groups is more preferred.

Of course, the resin layer need not be of two-layer structure and it is possible to make multilayer printed circuit boards with only a resin layer having properties between those of the first resin layer and the second resin layer, namely, it is soluble in aqueous alkali solution and has flowability upon heating, but does not completely flow out. However, as explained above, two-layer structure is more preferred for making high quality multilayer printed circuit boards.

The above resin compositions are used for making multilayer printed circuit boards having blind holes and an example of methods for making multilayer circuit boards having blind holes is as follows.

That is, a sheet prepared by previously coating the resin composition on a copper foil (hereinafter referred to as "resin-coated copper foil") is laminated on one or both sides of inner layer panel previously provided thereon with conductor patterns of copper foil or conductive paste. Etching resists are formed on the surface copper foil and selective etching is carried out to form fine holes (herein-after referred to as "via holes") in the surface copper foil above the specific conductor patterns on the inner layer panel in correspondence to the conductor patterns. Then, the resin layer under the holes is removed by aqueous alkali solution and the resin layer is heat cured. Thereafter, the conductor pattern on the inner layer panel and the copper foil of outer layer are electrically connected by a conductive material. Then, the copper foil of the outermost layer is subjected to selective etching to form desired patterns and thus a multilayer printed circuit board having blind holes can be produced.

Since resin-coated copper foil can be continuously produced and can be formed into the form of roll, multilayer printed circuit boards having blind holes can also be continuously produced and thus productivity is markedly improved.

Another method is as follows. The above-mentioned resin composition is coated on one or both sides of inner layer panel previously provided with conductor patterns and then, a copper foil is superposed on the resin layer by pressing or lamination to make an integral laminate. An etching resist is formed on the surface copper foil and is subjected to selective etching to form via holes in the surface copper foil above the specific conductor patterns on the inner layer panel in correspondence to the conductor patterns. Then, the resin layer under the holes is removed by aqueous alkali solution and the resin layer is heat cured. Thereafter, the conductor pattern on the inner layer panel and the copper foil of outer layer are electrically connected by a conductive material. Then, the copper foil of the outermost layer is subjected to selective etching to form desired patterns.

The above-mentioned resin compositions can be used as insulating layer of multilayer printed circuit boards in place of the prepreg and the resin-coated copper foil can also be applied to multilayer printed circuit boards by laminating it on the surface of printed circuit boards and using it as an electromagnetic shielding layer.

Resin-coated copper foil having an active energy ray curable resin layer of 1 to 25 μm thick on the side opposite to the resin-coated side, the surface of which is protected with a film is more effectively used in making multilayer printed circuit boards.

The active energy ray curable resin layer comprises binder polymer, active energy ray curable poly-functional monomer and polymerization initiator and may optionally contain thermal polymerization inhibitor, photoreaction sensitizer, antifoamer, leveling agent and pigment.

As the binder polymer, there may be used compositions comprising copolymers of methyl methacrylate as main component, at least one monomer selected from various (meth)acrylates, styrene and acrylonitrile, (meth)acrylic acids and the like, and optionally alkylvinyl ether/maleic anhydride half ester copolymers, styrene/maleic anhydride half ester copolymer or the like. As the active energy ray curable polyfunctional monomers, mention may be made of (meth)acryloyl group-containing polyfunctional monomers such as urethane acrylic type, epoxy acrylic type and various (meth)acrylate type which are radical polymerized with polymerization initiators and interlock with binder polymers and are crosslinking-cured to become insoluble in developers. As the polymerization initiators, mention may be made of hydrogen pulling type initiators such as benzophenone, thioxanthone and anthraquinone which cause generation of active radicals with ultraviolet rays to induce polymerization of monomers and intramolecular cleavage type initiators such as acetophenone and benzoin ethyl ether.

The active energy ray curable resin layer may be formed by transferring to a copper foil the resin layer previously coated at a thickness of 1 to 25 μm on a protective film such as polyester film or by directly coating the resin layer at a thickness of 1 to 25 μm on a copper foil and then applying a film such as polyester film thereto. If thickness of the resin layer is less than 3 μm, pinholes are apt to be formed in the resin layer and besides, the resin layer may be broken by spraying pressure of etching solution at the time of etching and the under layer copper foil is apt to be excessively etched. If it exceeds 25 μm, roll pressure in lamination of inner layer panel and copper-clad insulating sheet is absorbed by the resin layer having flexibility and smoothness of the surface copper foil cannot be obtained by the roll pressure to cause protrudent rising of the surface copper foil at the position of copper foil patterns on the inner layer panel.

Furthermore, it is also possible to directly electrodeposit on a copper foil a water-soluble or water-dispersible active energy ray curable composition which comprises an active energy ray curable resin such as acrylic resin, urethane resin, epoxy resin, polyester resin, polyether resin, alkyd resin, polyvinyl chloride resin, fluoro resin, silicone resin, vinyl acetate resin or polyvinyl alcohol; a monomer having (meth-)acryloyl group; a monomer having acidic group such as carboxyl group; and a water-insoluble photopolymerization initiator such as benzoin, benzoin ethyl ether, benzyl, diphenyl disulfide, eosin, thionine, diacetyl, Michler's ketone, acetophenone, benzophenone, thioxathone or anthraquinone.

The inner layer panel used for making the multilayer printed circuit boards of the present invention may be paper-phenol laminates, paper-epoxy laminates, glass-epoxy laminates, composite laminates, glass-polyimide laminates, polyester films, polyimide films and metal cores made by insulation treating metal substrates on which conductor wirings are formed.

Preferably, at least the blind hole portions of the surface of copper foil which forms the conductor patterns on the inner layer panel are provided with a plated film of gold, silver, nickel, chromium, tin, lead, rhodium, palladium or the like or a plated film of an alloy of two or more of these metals. By providing such film, when the resin layer is dissolved with aqueous alkali solution to form blind holes and the surface copper foil is etched in such a state that conductor pattern of inner layer panel is exposed, etching of the surface copper foil becomes possible with causing substantially no dissolution of the conductor pattern on the inner layer panel.

Furthermore, in order to enhance adhesion between the resin layer and the conductor pattern on the inner layer panel, it is preferred to subject the surface of the conductor pattern to roughening treatment, black oxide treatment, brown oxide treatment, red oxide treatment or the like.

Thickness of the surface copper foil can be determined depending on the characteristics required for the desired multilayer printed circuit board, but when a positive type etching is employed, thickness of the surface copper foil is preferably thinner than that of copper foil of the conductor pattern on the inner layer panel. For example, when thickness of the copper foil on the inner layer panel is 35 µm, a thickness of 18 µm is used for the surface copper foil. By employing such thicknesses, when blind holes are formed by dissolving the resin layer with aqueous alkali solution and the surface copper foil is etched in such a state that the conductor pattern on the inner layer panel is exposed, the copper foil of inner layer panel is not completely dissolved and is in the state of half etching and the surface oxide film is dissolved and moreover, the surface is in finely roughened state by the etching to cause increase in surface area of the copper foil. Thus, when the copper foil on inner layer panel and the surface copper foil are electrically connected by conductive paste in the later step, connection strength increases and the connection can be ensured.

In making the multilayer printed circuit board having via holes of the present invention, thickness of the resin layer put between the surface of conductor pattern on inner layer panel and the copper foil is preferably 20 to 150 µm. If it is less than 20 µm, insulation resistance between the layers and dielectric strength cannot be ensured and if it is more than 150 µm, undercutting becomes considerable due to dissolution with alkalis in formation of via holes of small diameter and sufficient reliability of connection by plating of via holes or by conductive paste cannot be attained.

Thicknesses of the first resin layer and the second resin layer in making printed circuit boards using two-layer structure resin layer are preferably 30 to 150 µm and 20 to 70 µm, respectively, although it depends on the thickness of the copper foil on inner layer panel.

Lamination of copper foil and inner layer panel with the resin layer being provided therebetween is preferably performed by heating and pressing by metal rolls. According to this method, lamination can be continuously carried out being different from usual lamination by a press and thus, productivity of multilayer printed circuit boards is markedly improved.

When a copper foil provided with resin layer is laminated of the inner layer panel in making the multilayer printed circuit boards having blind holes of the present invention, it is preferred to form a spacer of about 30 to 150 µm thick on a given portion of the inner layer panel in order to make constant the thickness of resin layer between the inner layer panel and the surface copper foil with avoiding influence by unevenness in thickness of the inner layer panel and by variation in roll pressure. In this case, it is further preferred to arrange the spacer at both ends of the inner layer panel in the direction vertical to axial direction of metal roll of laminator. Presence of the spacer can solve the problem that the resin layer flows to one side to increase unevenness of thickness of the resin layer in left and right and before and behind.

In the present invention, etching resist is used twice, namely, in forming fine holes (hereinafter referred to as "via holes") in the surface copper foil and in forming circuit pattern in the surface copper foil.

In that case, when resin-coated copper foil having protective film and coated with active energy ray curable resin is used, steps can be simplified and this is preferable.

For curing of the etching resist, active energy rays are selected depending on characteristics of the resin and pattern masks are provided at the positions where via holes are to be formed not so as to be irradiated with active energy rays.

Since the protective film in the resin-coated copper foil having protective film and coated with active energy ray curable resin normally transmits active energy rays, the mask patterns are preferably provided on this film. After curing the resin, the protective film is removed and development is carried out to remove the active energy ray curable resin at the position where blind holes are to be formed and the copper foil is etched to form via holes.

Etching solutions used are optionally selected from ferric chloride solution, cupric chloride solution, sulfuric acid/hydrogen peroxide solution, ammonium persulfate solution, sulfuric acid/hydrogen peroxide/ammonium solution and the like depending on plating metals.

When a positive type etching resist is used, since the portions which are not irradiated with active energy rays can be again exposed and developed, patterns can be formed twice by forming resist film once. Therefore, steps can be simplified, quantity of resist materials can be reduced resulting in effective utilization of resources and reduction in cost and besides, handling operations can be diminished owing to reduction in the number of steps and thus, the yield can be improved.

As the positive type etching resist, there may be used cresol novolak resin and/or poly(vinylphenol)/naphthoquinonediazidosulfonate esters, poly(p-butoxycarbinyl-oxystyrene) copolymers, poly(butyl p-vinylbenzoate) copolymers, poly((meth)acrylic acid) copolymers and poly(phthaialdehyde)/photo acid generating agents which can be exposed to active energy rays.

The above positive type etching resist is dissolved in suitable solvents. The solvents include, for example, methylcellosolve, ethylcellosolve, methylcellosolve acetate, ethylcellosolve acetate, butylcarbitol acetate, toluene, xylene, ethyl acetate, butyl acetate, N,N-dimethyl-formamide and N-methylpyrrolidone. These may be used each alone or in admixture.

The positive type etching resist can be coated on copper foil by spin coating, roll coating, curtain coating, dip coating, screen printing and other methods. If the etching resist is thin, etching solution penetrates the copper foil to form pin holes and if it is thick, excess exposure is necessary. Therefore, thickness after dried is preferably in the range of 1 to 15 μm, more preferably 3 to 8 μm.

Drying of the positive type etching resist after coated is carried out preferably at 70° to 130° C., more preferably 90° to 120° C. in the case of, for example, cresol novolak resin/naphthoquinonediazidosulfonate ester type etching resist. If the drying temperature is lower than 70° C., tackiness remains after drying and if it is higher than 130° C., photosensitive component in the etching resist begins to decompose resulting in reduction of sensitivity. Drying time is preferably 30 seconds to 60 minutes, more preferably 1 to 60 minutes.

Exposure of the positive type etching resist is carried out, for example, by irradiating with ultraviolet rays using normal ultra-high pressure mercury lamp or metal halide lamp through a phototool. Exposure quantity is preferably 10 to 800 mJ/cm2, more preferably 20 to 500 mJ/cm2 in formation of the first pattern for forming via holes in copper foil in the case of, for example, cresol novolak resin/naphthoquinonediazidosulfonate ester etching resist. In exposure for formation of the second pattern using positive type etching resist for forming circuit pattern in the surface copper foil after etching of the copper foil and dissolution of resin layer under via holes, it is preferably 30 to 1000 mJ/cm2, more preferably 50 to 700 mJ/cm2.

As developers for dissolving and removing the portions of the positive type etching resist which have been irradiated with ultraviolet rays, there may be used, for example, 1 to 5% aqueous solutions of sodium hydroxide, potassium hydroxide, potassium carbonate, sodium carbonate, sodium silicate, ammonia, ethylamine, diethylamine, triethylamine, tetramethylammonium hydroxide and ethanolamine.

Removal of the first etching resist can be carried out either after formation of via holes in the surface copper foil, after dissolution and removal of resin layer under via holes or after curing the resin layer around blind holes by active energy rays.

The resin layer under via holes formed in the surface copper foil can be dissolved with organic solvents, but more preferably is dissolved with aqueous alkali solutions because working environments are not contaminated and besides, from the points of reliability of via holes and operability.

That is, when the resin composition is dissolved with an organic solvent, this is swelling and dissoving reaction and boundary of the resin after dissolution is not smooth and roughened and in addition, there is the problem of the organic solvent remaining in the vicinity of the boundary. Therefore, when the via holes formed by dissolution of the resin are plated, owing to the remaining organic solvent or difficulty in electroless plating on boundary of the resin, pinholes are generated in plated film and even in the via holes which have been plated, the remaining organic solvent is evaplated to cause the problems such as formation of voids, bubbles or blisters and these make unstable the electrical and mechanical connection of conductive circuits between layers by the via holes and sufficient reliability in connection cannot be obtained.

On the other hand, when the resin is dissolved with an aqueous alkali solution, since the resin is dissolved by the reaction of alkali soluble groups such as carboxyl group and phenolilc hydroxyl group, dissolution rate is high and furthermore, the resin is dissolved successively from the portion which contacts with the aqueous alkali solution to give definite boundary of the resin. Moreover, if the boundary is washed with acids after dissolution of the resin with aqueous alkali solution, the alkali component does not remain and subsequent electroless plating can be satisfactorily performed and besides, no defects such as voids, bubbles and bliters occur. Thus, via holes of high reliability can be formed. In addition, working environment is not contaminated as in use of organic solvents and multilayer printed circuit boards having via holes can be easily produced through the steps of making conventional printed circuit boards. That is, when an alkali-soluble type etching resist is used for formation of via holes in copper foil, the resin layer under via holes of the copper foil can be dissolved simultaneously with removal of resist at the film removing step after etching of the copper foil. When an alkali developing type dry film is used as resist, the resin layer under via holes of the copper foil can be dissolved and removed simultaneously with removal of resist by aqueous sodium hydroxide solution used for peeling. Thus, this is further preferred.

When resin layer having alkali-soluble group such as carboxyl group or phenolic hydroxyl group is dissolved with aqueous alkali solution, the alkali matter which has reacted with carboxyl group or phenolic hydroxyl group remains and may cause corrosion of copper or reduction of electric characteristics. Therefore, it is preferred to wash with an acid such as dilute sulfuric acid after dissolution. When copper foil pattern of inner layer panel is subjected to treatments such as blackening treatment, coper oxide film formed by the blackening treatment dissolves to show color of copper in case resin is dissolved on the surface of the inner layer panel subjected to the blackening treatment in via holes when via holes are neutralizing with acid. If resin remains on the surface of the flim subjected to blackening treatment, color of copper does not appear and thus whether the dissolution with alkali is satisfactory or not can be judged by this neutralizing treatment.

After the portions of the resin layer under via holes are dissolved, the resin layer is cured. This curing is carried out, for example, by heating and the heating temperature is preferably in the range of 80° to 180° C., more preferably in the range of 150 to 170° C. If it exceeds 180° C., prepreg which constitutes the inner layer panel is deteriorated and if it is lower than 80° C., curing requires much time and besides, crosslinking is insufficient and insulation resistance may not be sufficiently developed.

Furthermore, when blind holes are made accoridng to the method of the present invention, the diameter of the holes formed in the inner resin layer is apt to be larger than that of via holes formed in the surface copper foil to cause problems in through-out plating at the later step. Therefore, heating may be previously carried out at 80° to 120° C. for about 5 to 15 minutes to intentionally flow the resin and curing with ultraviolet rays may be carried out at the time when the diameter of via holes becomes nearly equal to that of holes in the resin layer.

Ordinary UV lamp can be used for irradiation of ultraviolet rays and scattered light is preferred.

Furthermore, the above-mentioned curing is more preferably carried out in combination with curing with ultraviolet rays and active energy ray in order to prevent flowing out of the resin around blind holes. For this purpose, a resin composition containing active enery ray curing reaction initiator and active energy ray curing reaction sensitizer is used as the resin composition of the present invention. When diameter of blind holes is small, resin flows out upon heating and in the portion where much resin flows, the resin covers the surface of conductor pattern on the inner layer panel and there is the possibility that electrical connection cannot be obtained even by through-hole plating or coating with conductive paste. Therefore, the resin facing the blind hole under the via hole of copper foil is irradiated with active energy rays to allow curing of the resin to proceed at the state when the resin begins to flow by heating or before heating, whereby a dam of resin flow can be formed and thus more flowing of resin than needed can be prevented. In the case of irradiation with electron rays, when it is conducted at 180 to 300 kV with 10 to 30 Mrad, not only the resin layer around via holes can be cured, but also the resin layer under the copper foil of 18 to 35μ can be cured by penetration of electron rays through the copper foil.

When positive type etching resist is used, it is preferred for simplification of steps that at the step to form circuit patterns by exposing and developing, blind holes are also irradiated with active energy rays to simultaneously cure the resin layer aroung blind holes.

Furthermore, in the case of the resin layer exposed by selective etching for forming circuit patterns in the surface copper foil being active energy ray curable and being in uncured state, it is preferred to irradiate the surface of the resin layer with active energy rays to half-cure the surface, because subsequent handling is easy.

When blind holes are plated with copper, for removing bubbles which are present from the first or chemically generated in the blind holes, it is preferred to apply ultrasonic wave continuously or intermittently to the blind holes at one or more steps of degreasing, soft-etching and activation which are pretreatments for plating, electroless copper plating and electrolytic copper plating.

Electric connection of conductor pattern of inner layer panel with copper foil of outer layer can be performed, for example, by electroless plating and/or electrolytic plating or coating conductive pastes such as gold, silver, copper and solder by screen printing, dispenser, pin printing and the like and drying and curing the coated paste. This conductive paste is heat cured simultaneously with or separately from heat curing of resin layer, but simultaneous curing is preferred for simplification of the steps.

There is no special limitation in sequence of the step of coating conductive paste on blind holes and drying it, the step of curing the resin layer or simultaneously curing the resin layer and the conductive paste, the step of forming the second etching resist or positive type etching resist on the surface copper foil and forming circuit pattern by selective etching and the step of removing the resist.

Naturally, however, curing of conductive paste is carried out after coating it on blind holes and drying it and removal of the second etching resist or positive type etching resin is carried out after the step of forming the circuit patter by selective etching using the resist.

On the thus obtained multilayer printed circuit board having blind holes, another resin layer may be formed and another copper foil is laminated thereon, or another resin-coated copper foil is further laminated. By repeating this porcedure, there can also be obtained a multilayer printed circuit board having blind holes with six or more layers.

EXAMPLE 1

Synthesis of Base Resin 983 g of cresol novolak type resin (Epototo YDCN 704 manufactured by Toro Kasei Co.) and 742 g of ethylcarbitol acetate were charged in a 3 liter flask and heated to 110° C. to dissolve. After adding 1.12 g of phenothiazine (radical polymerization inhibitor) and 11.21 g of tetrabutyl-ammonium bromide (catalyst), the content was kept at 110°±5° C. and thereto was gradually dropped 337 g of acrylic acid over a period of 3 hours. Thereafter, reaction was carried out for about 8 hours at 120 ±5° C. until acid value was found to reach nearly 0 from 2.23 with the acid value being measured by neutralization titration. Then, 138 g of succinic anhydride was added and with keeping at 110°±5° C., reaction was allowed to proceed for 3 hours from the point of time when succinic anhydride was disoslived, to obtain novolak type epoxy acrylate having carboxyl group.

Preparation of First Resin Composition

To 590 g of the above novolak type epoxy acrylate having carboxyl group were added 280 g of calcined clay subjected to treatment with silane coupling agent as a filler, 20 g of Irgacure 907 manufactured by Ciba-Geigy Corp. as an active energy ray reaction initiator, 4 g of Kayacure EPA manufactured by Nippon Kayaku Co., Ltd. as an active energy ray reaction sensitizer, 8 g of Aerosil and and 278 g of urethane acrylate (Aronix M-1700 manufactured by Toagosei Chemical Industry Co., Ltd.) and were further added a solution of 157 g of brominated carbonate oligomer (Fireguard 8500 manufactured by Teijin Kasei Co.) in methyl ethyl ketone and a solution of 40 g of Percumyl D manufactured by Nippon Oil & Fats Co., Ltd. in xylene as a curing agent. Then, the mixture was passed thrice through a three-roll mill to prepare the first resin composition.

Preparation of Second Resin Composition

To 590 g of the novolak type epoxy acrylate having carboxyl group obtained above were added 20 g of Irgacure 907 manufactured by Ciba-Geigy Corp. as an active energy ray reaction initiator, 4 g of Kayacure EPA manufactured by Nippon Kayaku Co., Ltd. as an active energy ray reaction sensitizer and 278 g of urethane acrylate (Aronix M-1700 manufactured by Toagosei Chemical Industry Co., Ltd.) and were further added a solution of 157 g of brominated carbonate oligomer (Fireguard 8500 manufactured by Teijin Kasei Co.) in methyl ethyl ketone and a solution of 45 g of Percumyl D manufactured by Nippon Oil & Fats Co., Ltd. in xylene as a curing agent. Then, the mixture was passed thrice through a three-roll mill to prepare the second resin composition.

Production of Multilayer Printed Circuit Board

Production method of multilayer printed circuit board having via holes using a resin-coated copper foil according to the present invention will be explained referring to the accompanying drawings. FIG. 1 to FIG. 9 are schematic sectional views which explain steps of production and construction of multilayer printed circuit board using the resin compositions of the present invention.

The first resin composition prepared above was coated on a matted surface of a matted copper foil 1 of 18 μ thick by a bar coater and dried by passing it through far infrared ray conveyor at 120° C. for 30 seconds and at 140° C. for 30 seconds to form a resin layer of 70μ thick.

The second resin composition was similarly coated on the first resin layer and dried to form a resin layer of 30μ thick and thus resin-coated copper foil 4 was prepared.

Inner layer panel 7 was prepared by forming copper circuit pattern 6 at the given positions on a glassy epoxy sheet having on each side a copper foil of 35μ thick by selective etching. The surface of copper circuit pattern 6 of inner layer panel 7 was treated with a solution comprising 37 g/l of sodium chlorite, 10 g/l of sodium hydroxide and 20 g/l of trisodium phosphate 12 hydrate at 95° C. for 5 minutes, thoroughly washed with water, dried and subjected to blackening treatment.

Figure 2:
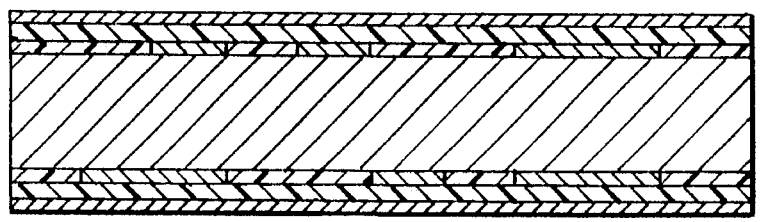
FIG. 2 is a schematic sectional view which shows construction of the copper-clad laminate panel after heat pressed in the above process.
Figure 3:
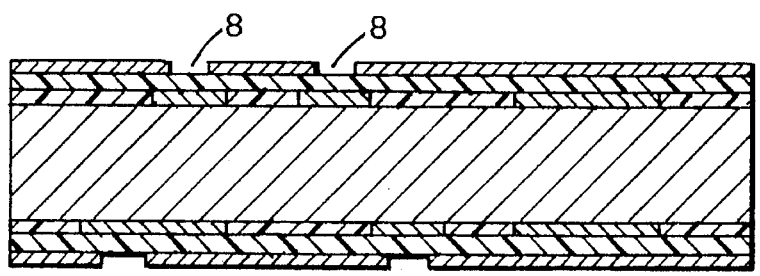
FIG. 3 is a schematic sectional view of the copper-clad laminate panel after via holes are formed in the surface copper foil by etching in the above process.
Figure 4:
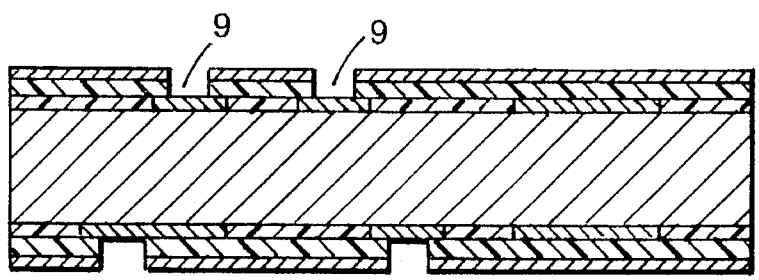
FIG. 4 is a schematic sectional view of the copper-clad laminate panel after the resin layer under the copper foil via holes is dissolved in the above process.

Then, the resin-coated copper foils 4 were superposed on both sides of inner layer panel 7 and laminated by metal rolls at 75° C. to obtain a copper-clad laminate panel containing the inner layer panel. Since the second resin layer 3 had high flowability, the resin flowed between copper circuit patterns 6 and since the first resin layer 2 showed substantially no flowability, this first resin layer 2 contacted with the copper circuit patterns 6 on the inner layer panel. Thus, a copper-clad laminate panel as shown in FIG. 2 was obtained.

An alkali-soluble etching resist was formed by screen printing method on the portions of the surface of copper foil 4 of the copper-clad laminate panel excluding the portions where via holes of 0.1 to 0.3 mm θ were to be formed in the copper foil and copper of the via hole portions was etched with ferric chloride solution. In subsequent removal of the film with 2 wt % aqueous sodium hydroxide solution, the first resin layer 2 of the inner layer of the portions of via holes 8 was also simultaneously dissolved and removed to expose the copper circuit patterns 6. No residue of the resin was recognized.

Figure 5:
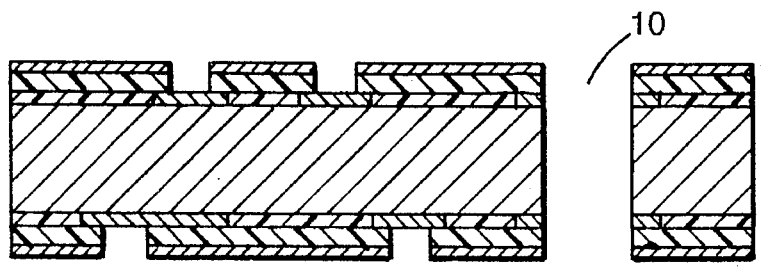
FIG. 5 is a schematic sectional view of the copper-clad laminate panel after through-holes are formed in the above process.
Figure 6:
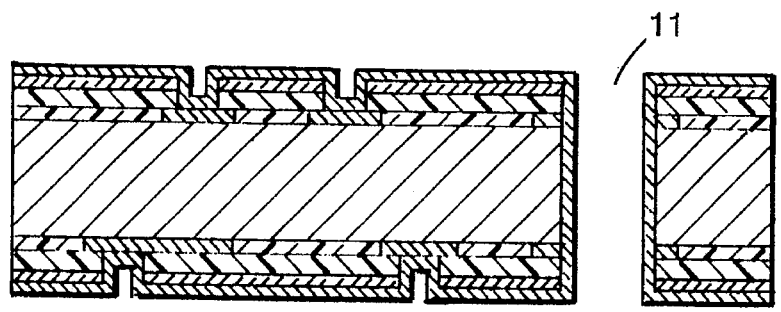
FIG. 6 is a schematic sectional view of the copper-clad laminate panel after plating is carried out in the above process.
Figure 7:
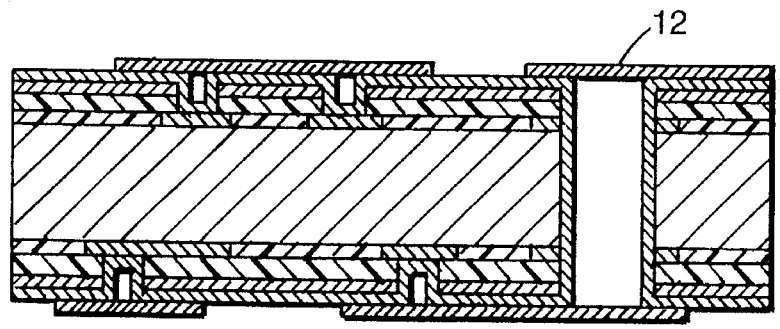
FIG. 7 is a schematic sectional view of the copper-clad laminate panel after etching resist is formed in the above process.
Figure 8:
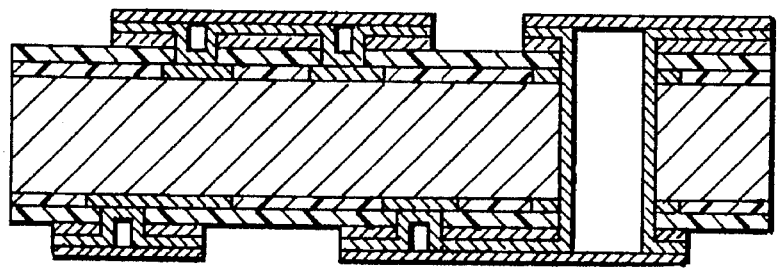
FIG. 8 is a schematic sectional view of the copper-clad laminate panel after unnecessary copper foil is removed by etching in the above process.
Figure 9:
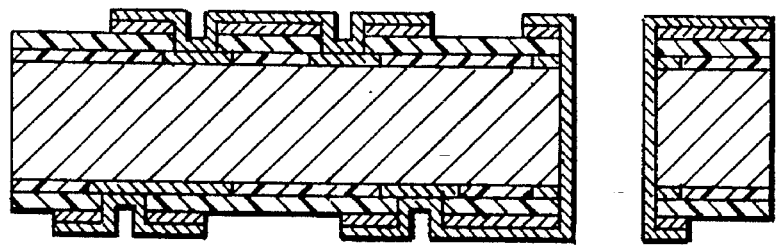
FIG. 9 is a schematic sectional view of the copper-clad laminate panel after the etching resist is removed in the above process.
Figure 10:
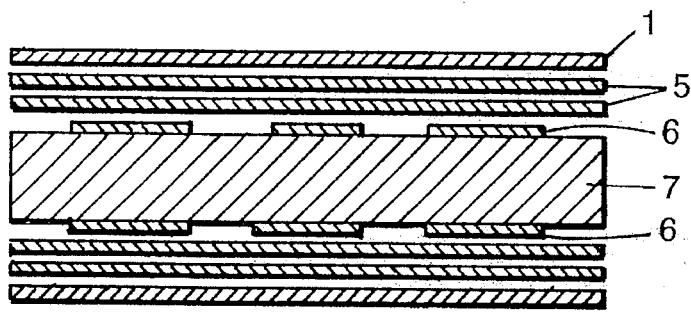
FIG. 10 is a schematic sectional view which shows constructions of an inner layer panel having copper circuit patterns on its surface and a copper foil having a prepreg therebetween before they are heat pressed for lamination in the process of production of conventional multilayer printed circuit board having via holes.
Figure 11:
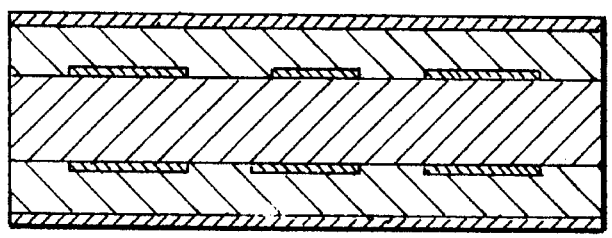
FIG. 11 is a schematic sectional view which shows construction of the copper-clad laminate panel after heat pressed in the process of FIG. 10.
Figure 12:
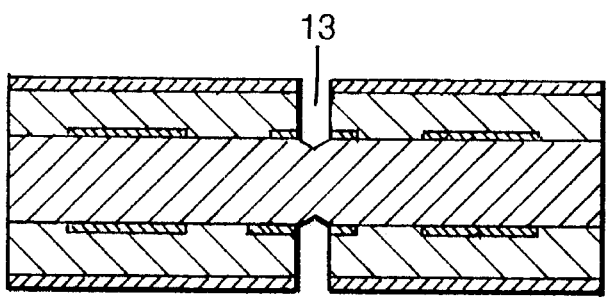
FIG. 12 is a schematic sectional view of the copper-clad laminate panel after blind via holes are formed by drilling operation in the process Of FIG. 10.
Figure 13:
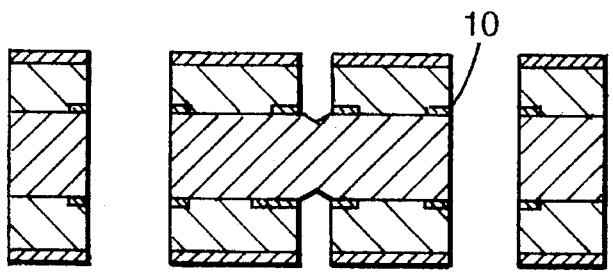
FIG. 13 is a schematic sectional view of the copper-clad laminate panel after through-holes are formed by drilling operation in the process of FIG. 10.
Figure 14:
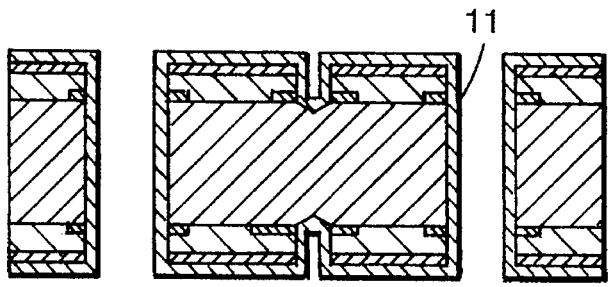
FIG. 14 is a schematic sectional view of the copper-clad laminate panel after plating is carried out in the process of FIG. 10.
Figure 15:
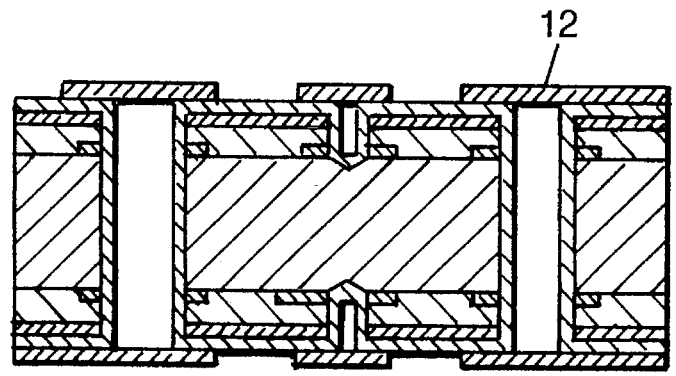
FIG. 15 is a schematic sectional view of the copper-clad laminate panel after etching resist is formed in the process of FIG. 10.
Figure 16:
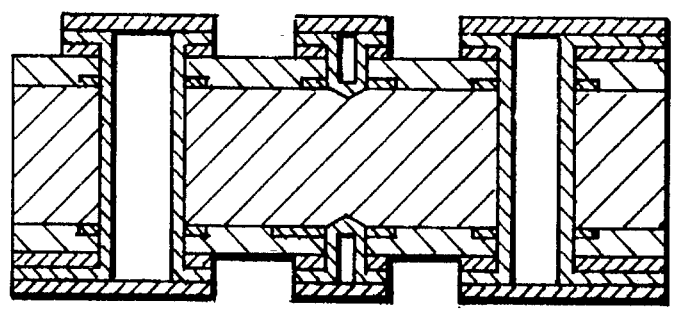
FIG. 16 is a schematic sectional view of the copper-clad laminate panel after unnecessary copper foil is removed by etching in the process of FIG. 10.
Figure 17:
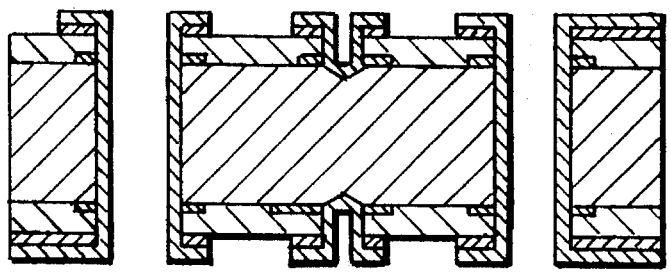
FIG. 17 is a schematic sectional view of the copper-clad laminate panel after the etching resist is removed in the process of FIG. 10.
Figure 18:
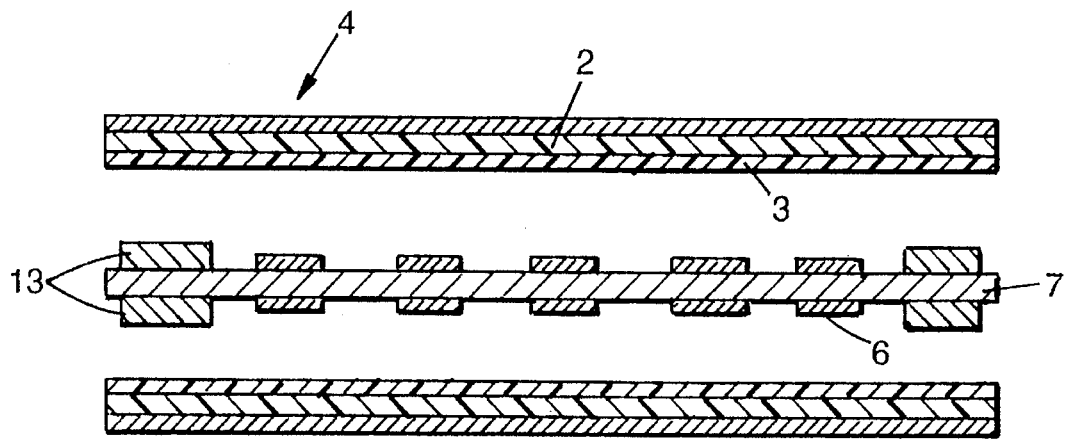
FIG. 18 is a schematic sectional view which shows the process of superposing copper-clad insulating sheets on inner layer panel having spacers thereon in Example 9.
Figure 19:
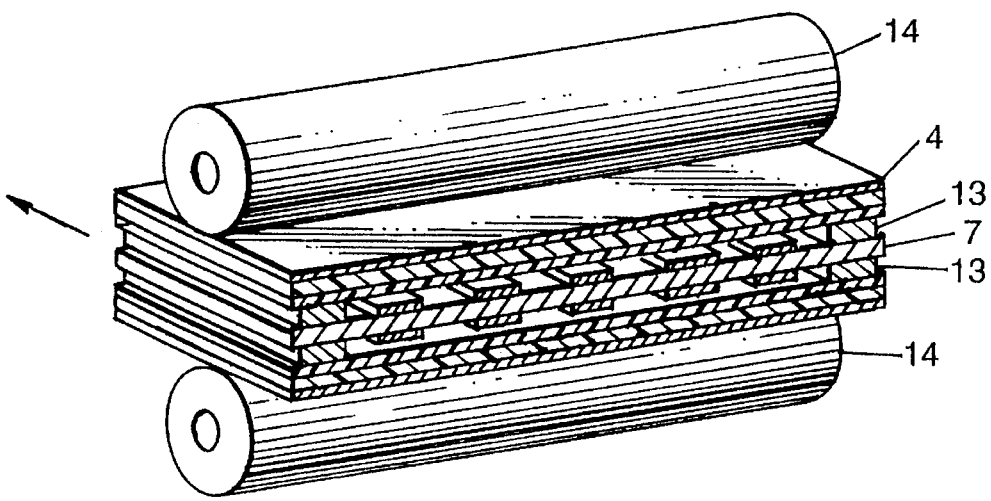
FIG. 19 is a schematic oblique view which shows the step of lamination by metal rolls in Example 9.

Successively, the panel was washed with water and 10% aqueous sulfuric acid solution and then, the portion of blind via holes where resin was exposed was irradiated with ultraviolet rays to cure the surface of the resin. Thereafter, the panel was predried at 100° C. for 30 minutes and then, aged at 170° C. for 30 minutes to cure the first resin layer 2 and the second resin layer. Thereafter, as shown in FIG. 5, through-hole 10 which requires connection of copper circuit pattern 6 and copper foil 4 of outer layer was formed by drilling operation and as shown in FIG. 6, blind via holes and through-holes were simultaneously subjected to through-hole plating to form plating layer 11. Then, as shown in FIG. 7, FIG. 8 and FIG. 9, etching resist 12 was formed and etching and removal of film were conducted to obtain a multilayer printed circuit board having blind via holes.

Peel strength between copper foil and resin layer of the resulting printed circuit board was 1.6 kg/cm. Soldering heat resistance of 25 mm square pattern was satisfactory at 260° C. for 3 minutes. Surface insulation resistance was initially $10^{14}$ Ω and $10^{12}$ Ω after moisture resistant test (C-96/40/95). Dielectric strength was DC 1000 V and was satisfactory. Blind via holes showed substantially no change in resisntance after subjected to test of 100 temperature cycles, one cycle comprising 125° C., 30 minutes and −65° C., 30 minutes.

EXAMPLES 2–7 AND COMPARATIVE EXAMPLES 1–2

Resin compositions were obtained in the same manner as in Example 1 except that the blending ratios were those shown in Table 1.

TABLE 1

| | | Comparative Example 1 | Comparative Example 2 | Example 2 | Example 3 | Example 4 | Example 5 | Example 6 | Example 7 |
|---|---|---|---|---|---|---|---|---|---|
| The first resin layer | Epoxy acrylate having carboxyl group | 100 | 100 | 100 | 100 | 100 | 100 | 100 | 100 |
| | Ethylcarbitol | 100 | 100 | 100 | 100 | 100 | 100 | 100 | 100 |
| | Urethane acrylate | — | — | 40 | 40 | 80 | 80 | 80 | 80 |
| | Brominated carbonate oligomer | — | — | — | — | — | 20 | 40 | 60 |
| | Talc | 100 | — | 50 | — | — | — | — | — |
| | Calcined clay subjected to treatment with silane coupling agent | — | 100 | 50 | 100 | 100 | 100 | 100 | 100 |
| | Aerosil | 1 | 1 | 1 | 1 | 1 | 1 | 1 | 1 |
| | Irgacure 907 | 5 | 5 | 5 | 5 | 5 | 5 | 5 | 5 |
| | Kayacure EPA | 2 | 2 | 2 | 2 | 2 | 2 | 2 | 2 |
| | Dicumyl peroxide | 3 | 3 | 3 | 3 | 3 | 3 | 3 | 3 |
| The second resin layer | Epoxy acrylate having carboxyl group | 100 | 100 | 100 | 100 | 100 | 100 | 100 | 100 |
| | Ethylcarbitol | 100 | 100 | 100 | 100 | 100 | 100 | 100 | 100 |
| | Brominated carbonate | — | — | — | — | — | 15 | 30 | 45 |
| | Irgacure 907 | 5 | 5 | 5 | 5 | 5 | 5 | 5 | 5 |
| | Kayacure EPA | 2 | 2 | 2 | 2 | 2 | 2 | 2 | 2 |
| | Dicumyl peroxide | 3 | 3 | 3 | 3 | 3 | 3 | 3 | 3 |

Each of the resin compositions for the first resin layer obtained in Examples 2–7 and Comparative Examples 1–2 of Table 1 was coated on toughened surface of copper foil 1 having a thickness of 18 μm by screen printing method and dried at 75° C. for 10 minutes to evaporate the solvent and one more coat was screen-printed thereon and dried at 75° C. for 10 minutes to evaporate the solvent to obtain the first resin layer of 70 to 100 μm thick which was soluble in solvent and aqueous alkali solution and had low flowability of resin even under heating.

Each of the resin compositions for the second resin layer obtained in Examples 2–7 and Comparative Examples 1–2 of Table 1 was coated on the above-mentioned first resin layer by screen printing method, dried at 75° C. for 10 minutes to completely evaporate the solvent and cooled to obtain a resin-coated copper foil having the second resin layer having a thickness of 30 μm and soluble in solvents and aqueous alkali solutions and having high flowability at heating.

Multilayer printed circuit boards were obtained in the same manner as in Example 1.

Similar circuit boards could also be obtained when the copper-clad laminate panel was produced by hot pressing at 75° C. and 25 kg/cm2 for 10 minutes in place of lamination by roll.

Physical properties, namely, peel strength of copper foil and soldering heat resistance, electric properties, namely, surface insulation resistance and dielectric strength and flame retardance of the resulting printed circuit boards were evaluated in the same manner as in Example 1 and the results are shown in Table 2.

An inner layer panel was prepared by forming copper circuit pattern at the given positions of a glass epoxy sheet having on each side a copper foil of 35μ thick by selective etching. A resin coated copper foil was superposed on each side of the inner layer panel, followed by pressing at 80° C. and 25 kg/cm2 for 10 minutes. Since the second resin layer was high in flowability, the resin flowed between the copper circuit patterns and since the first resin layer had substantially no flowability, the first resin layer contacted with the copper circuit patterns of the inner layer. Thus, a copper-clad laminate panel was obtained.

An alkali-soluble type etching resist was formed by screen printing method on the portions of the surface of copper foil of the above copper-clad laminate panel excluding the portions where via holes 8 of 0.1 to 0.3 mm ∪ were to be formed in the copper foil and copper of the via hole portions of the copper foil was etched with ferric chloride solution. In subsequent removal of the film with 2 wt % aqueous sodium hydroxide solution, portions of the first resin layer at the via holes were also simultaneously dissolved and removed to expose the copper circuit patterns of the inner layer.

TABLE 2

|  | Comparative Example 1 | Comparative Example 2 | Example 2 | Example 3 | Example 4 | Example 5 | Example 6 | Example 7 |
| --- | --- | --- | --- | --- | --- | --- | --- | --- |
| Copper foil peeling strength (kgf/cm) | 0.5 | 0.9 | 1.0 | 1.2 | 1.4 | 1.5 | 1.6 | 1.6 |
| Soldering heat resistance (min) (Solder float 260° C.) | 3 | 3 | 3 | 3 | 3 | 3 | 3 | 3 |
| Surface insulation resistance (log Ω) (initial) | 11 | 12 | 13 | 14 | 14 | 14 | 14 | 14 |
| Surface insulation resistance (log Ω) (C-96/40/95) | 9 | 10 | 11 | 12 | 12 | 12 | 12 | 12 |
| Dielectric strength (DC volt) | 500 | 500 | 800 | 800 | 1000 | 1500 | 1500 | 1100 |
| Flame retardance (UL-94) | V-1 | V-1 | V-1 | V-1 | V-1 | V-0 | V-0 | V-0 |

(Measuring method)
Copper foil peeling strength: JIS C5012
Soldering heat resistance: JIS C5012
Surface insulation resistance: JIS C5012 (Test pattern: Comb-shaped pattern B of IPC B-25)
Dielectric strength: JIS C5012 (M was used as test pattern)
Flame retardance: UL94

EXAMPLE 8

To a mixture comprising 100 parts by weight of ethylcarbitol acetate and 100 parts by weight of novolak type epoxy acrylate having carboxyl group were added 70 parts by weight of talc containing 1 part by weight of Aerosil as a filler and 3.6 parts by weight of dicumyl peroxide as a curing agent. The resulting composition was coated at a thickness of 50μ (after dried) on roughened surface of a copper foil of 18 μm thick and dried at 80° C. for 60 minutes to evaporate the solvent, to obtain the first resin layer soluble in solvents and aqueous alkali solutions and low in flowability even at heating.

A composition comprising 100 parts by weight of novolak type epoxy acrylate having carboxyl group, 100 parts by weight of ethylcarbitol acetate as a solvent and 3.6 parts by weight of dicumyl peroxide as a curing agent was coated at a thickness of 30 μm (after dried) on the first resin layer, dried at 80° C. for 60 minutes to completely evaporate the solvent and cooled to obtain a resin-coated copper foil having the second resin layer soluble in solvents and aqueous alkali solutions and high in flowability at heating.

Successively, the panel was washed with water and 2% aqueous sulfuric acid solution, then predried at 100° C. for 30 minutes and thereafter, aged at 150° C. for 60 minutes to cure the first resin layer and the second resin layer. Thereafter, through-hole which requires connection of the copper circuit pattern of the inner layer panel and copper foil of outer layer was formed by drilling operation and blind holes and through-holes were simultaneously subjected to through-hole plating. Then, etching resist was formed and etching and removal of film were conducted to obtain a multilayer printed circuit board having blind holes.

In this Example, the laminate panel was produced by pressing, but similar printed circuit board could be obtained when the laminate panel was produced by roll lamination at 80° C.

EXAMPLE 9

To a mixture comprising 100 parts by weight of ethylcarbitol acetate and 100 parts by weight of novolak type epoxy acrylate having carboxyl group were added 70 parts by weight of talc containing 1 part by weight of Aerosil as a filler, 3.6 parts by weight of dicumyl peroxide as a curing agent, 5 parts by weight of Irgacure 907 as an initiator for ultraviolet ray curing reaction and 2 parts by weight of Kayacure EPA as an ultraviolet curing sensitizing agent. The resulting composition was coated at a thickness of 110 μm (after dried) on roughened surface of copper foil 4 of 18 μm thick and dried at 75° C. for 30 minutes to evaporate the solvent, to obtain the first resin layer soluble in solvents and aqueous alkali solutions and low in flowability even under heating.

A composition comprising 100 parts by weight of novolak type epoxy acrylate having carboxyl group, 100 parts by weight of ethylcarbitol acetate as a solvent, 3.6 parts by weight of dicumyl peroxide as a curing agent, 5 parts by weight of Irgacure 907 as an initiator for ultraviolet ray curing reaction and 2 parts by weight of Kayacure EPA as an ultraviolet curing sensitizing agent was coated at a thickness of 30 μm (after dried) on the first resin layer, dried at 75° C. for 10 minutes to completely evaporate the solvent and cooled to obtain copper foil 1 having the second resin layer soluble in solvents and aqueous alkali solutions and high in flowability at heating.

An inner layer panel was prepared by forming copper circuit pattern at the given positions of a glass epoxy having on each side a copper foil of 35 μm thick by selective etching. The surface of copper circuit pattern of the inner layer panel was treated with a solution comprising 37 g/l of sodium chlorite, 10 g/l of sodium hydroxide and 20 g/l of trisodium phosphate 12 hydrate at 95° C. for 5 minutes, thoroughly washed with water, dried and subjected to blackening treatment.

As spacer, cellophane tapes of 100 μm thick were applied onto both end portions of both sides of the inner layer panel so that the cellophane tape was positioned in the direction vertical to the axial direction of metal roll and copper foils having resin layer were superposed on both sides of the inner layer panel (FIG. 18, FIG. 19) and these were laminated by metal rolls at 75° C. and an air pressure of 2 kg/cm2. Since the second resin layer was high in flowability, the resin flowed between the copper circuit patterns and since the first resin layer had substantially no flowability, the first resin layer contacted with the copper circuit patterns of the inner layer. Thus, a copper-clad laminate panel was obtained. Since there were provided spacers of cellophane tapes on both end portions of the inner layer panel, flowing of the resin to one side of left or right due to variation in balancing between left and right did not occur and rippling of the laminate in running direction due to unevenness in thickness of the inner layer panel were few. As a result, there was able to be formed a resin layer having a uniform thickness of 100±10 μm between the copper foil of inner layer and the copper foils of outer layers.

An alkali-soluble type etching resist was formed by screen printing method or photo method on the portions of the surface of copper foil of the above copper-clad laminate panel excluding the portions where via holes of 0.1 to 0.3 mm θ were to be formed in the copper foil and copper of the via hole portions of the copper foil was etched with ferric chloride solution. In subsequent removal of the film with 2 wt % aqueous sodium hydroxide solution, portions of the first resin layer at the via holes were also simultaneously dissolved and removed to expose the copper circuit patterns of the inner layer. When dissolution of the resin was insufficient, the resin layer was washed with 2 wt % sodium carbonate solution.

Successively, the panel was washed with running water for 1 minute, with 2% aqueous sulfuric acid solution, and further with running water for 1 minute and then dried. Thereafter, the blind holes were irradiated with irregularly reflected ultraviolet rays to cure the surface of the resin layer and then, precuring at 100° C. for 30 minutes and aging at 150° C. for 60 minutes were carried out to cure the first resin layer and the second resin layer. Thereafter, through-hole which connects the copper circuit pattern of the inner layer panel with copper foil of the outer layers was formed by drilling operation.

In subjecting blind holes and through-holes simultaneously to through-hole plating, degreasing was carried out at high temperatures of 70° to 80° C. with removing bubbles in the blind holes as much as possible, and after sufficient washing with water, soft etching treatment, washing with water, acidification treatment, activation treatment, washing with water, stabilizing treatment and washing with water were conducted in succession and the panel was dipped in electroless copper plating bath and applied with ultrasonic wave for 10 seconds every 1 minute and plating was carried out for totally 20 minutes while removing hydrogen gas generated by the electroless copper plating to deposit plated copper of 0.5 μm thick on the whole surface including blind holes. Successively, electrolytic copper plating was carried out for 60 minutes to deposit electrolytic copper of 25 μm thick on blind holes and the whole surface.

Then, etching resist was formed and etching and removal of film were carried out to obtain a multilayer printed circuit board of four conductor layers which had blind holes and in which copper circuit pattern of inner layer panel and copper pattern of outer layer were electrically connected.

The resulting multilayer printed circuit board having blind holes was subjected to moisture resistance test, soldering heat resistance test and test of peel strength test of the surface copper foil.

The moisture resistance test was carried out by forming a comb-shaped pattern having a space of 0.15 mm between conductors and measuring initial insulation resistance between copper circuit pattern of inner layer panel and copper pattern of outer layer and that after 96 hours under 40° C. and a humidity of 95% in accordance with IPC B25 standard. As a result, initial value was $10^{13}$ Ω and the value obtained after 96 hours was $10^{11}$ Ω.

The soldering heat resistance was evaluated by solder float test at 260° C. for 3 minutes to find that it had satisfactory heat resistance. Peel strength of the surface copper foil was 0.7 kg/cm.

EXAMPLE 10

The resin composition used in Example 9 which was soluble in aqueous alkali solutions and low in flowability even under heating was coated at a thickness of 110 μm (after dried) on both sides of the inner layer panel obtained as in Example 9 and dried at 75° C. for 30 minutes to evaporate the solvent, to form a resin layer soluble in solvents and aqueous alkali solutions and low in flowability even under heating.

Copper foils of 18 μm thick were superposed on both sides of the inner layer panel having resin layer provided as mentioned above in the manner that roughened surfaces of the foils faced the inner layer panel, and these were laminated at 75° C. and under an air pressure of 2 kg/cm2 to obtain a copper-clad laminate panel. The resin layer between the copper foil of inner layer panel and copper foil of outer layer had a uniform thickness of 90±10 μm.

A multilayer printed circuit board having four conductor layers and having blind holes in which copper circuit pattern of inner layer panel and copper circuit pattern of outer layer were electrically connected was obtained in the same manner as in Example 9 using the above copper-clad laminate panel. The resulting printed circuit board had the similar properties as those of Example 9.

EXAMPLE 11

An active energy ray curable resin composition was prepared by dissolving 30 parts by weight of styrene/maleic anhydride half ester copolymer, 50 parts by weight of methyl methacrylate/ethyl acrylate/acrylic acid copolymer, 30 parts by weight of trimethylolpropane triacrylate, 8 parts by weight of benzoinisopropyl ether and 0.05 part by weight of monomethoxyhydroquinone in 20 parts by weight of methyl ethyl ketone. This composition was coated on a continuous copper foil by roll coating method and dried at 80° C. for 15 minutes to form an active energy ray curable resin layer of 10 μm thick.

The above continuous copper foil coated with active energy ray curable resin layer was rolled up together with a continuous polyester film of 20μ used as a release sheet and a protective film.

To a mixture comprising 100 parts by weight of ethylcarbitol acetate and 100 parts by weight of novolak type epoxy acrylate having carboxyl group were added 70 parts by weight of talc containing 1 part by weight of Aerosil as a filler and 3.6 parts by weight of dicumyl peroxide as a curing agent. The resulting composition was continuously roll coated at a thickness of 50μ (after dried) on the roughened surface of the above continuous copper foil of 18 μm thick which was opposite to the active energy ray curable resin-coated side and dried at 75° C. for 10 minutes to evaporate the solvent, thereby continuously forming the first resin layer soluble in solvents and aqueous alkali solutions and low in flowability even under heating.

A composition comprising 100 parts by weight of novolak type epoxy acrylate having carboxyl group, 100 parts by weight of ethylcarbitol acetate as a solvent and 3.6 parts by weight of dicumyl peroxide as a curing agent was coated at a thickness of 30 μm (after dried) on the first resin layer formed on the above continuous copper foil coated with the active energy ray curable resin layer, dried at 75° C. for 10 minutes to completely evaporate the solvent and cooled to obtain a resin-coated copper foil having the second resin layer soluble in solvents and aqueous alkali solutions and high in flowability at heating. This sheet was wound up in the form of a roll.

An inner layer panel was prepared by forming copper circuit pattern at the given positions of a glass epoxy sheet having on each side a copper foil of 35μ thick by selective etching. The above resin-coated copper foils were superposed on both sides of the inner layer panel and these were laminated by metal rolls at 75° C. and an air pressure of 2 kg/cm2 and at a speed of 0.2 m/min. Since the second resin layer was high in flowability, the resin flowed between the copper circuit patterns and since the first resin layer had substantially no flowability, the first resin layer contacted with the copper circuit patterns of the inner layer. Thus, a copper-clad laminate panel was obtained.

The portions of the active energy ray curable resin layer of the above copper-clad laminate panel excluding the portions where via holes 8 of 0.1 to 0.3 mm θ were to be formed in the copper foil were cured by irradiation with ultraviolet rays and the protective film was removed. Then development was carried out with sodium carbonate solution to form an etching resist and copper of the via hole portions of the copper foil was etched with ferric chloride solution. In subsequent removal of the film with 2 wt % aqueous sodium hydroxide solution, the first resin layer of the under portions of via holes was also simultaneously dissolved and removed to expose the copper circuit patterns of the under layer.

Successively, the panel was washed with water and 2% aqueous sulfuric acid solution, then predried at 100° C. for 30 minutes and thereafter, aged at 150° C. for 60 minutes to cure the first resin layer and the second resin layer. Thereafter, through-hole which requires connection of the copper circuit pattern of the inner layer panel and copper foil of outer layer was formed by drilling operation and blind holes and through-holes were simultaneously subjected to through-hole plating. Then, etching resist was formed and etching and removal of film were conducted to obtain a multilayer printed circuit board having blind holes.

EXAMPLE 12

To a mixture comprising 100 parts by weight of ethylcarbitol acetate and 100 parts by weight of novolak type epoxy acrylate having carboxyl group were added 80 parts by weight of urethane acrylate, 40 parts by weight of brominated polycarbonate oligomer, 5 parts by weight of active energy ray curing reaction initiator, 2 parts by weight of active energy ray curing reaction sensitizing agent, 100 parts by weight of calcined clay treated with silane coupling agent and containing 1 part by weight of Aerosil as a filler and 3.6 parts by weight of dicumyl peroxide as a curing agent. The resulting composition was coated at a thickness of 70μ (after dried) on the roughened surface of a copper foil of 35 μm thick and dried at 75° C. for 10 minutes to evaporate the solvent, thereby forming the first resin layer soluble in solvents and aqueous alkali solutions and low in flowability even under heating.

A composition comprising 100 parts by weight of novolak type epoxy acrylate having carboxyl group, 100 parts by weight of ethylcarbitol acetate as a solvent, 40 parts by weight of brominated polycarbonate oligomer, 5 parts by weight of active energy ray curing reaction initiator, 2 parts by weight of active energy ray curing reaction sensitizing agent and 3.6 parts by weight of dicumyl peroxide as a curing agent was coated at a thickness of 30 μm (after dried) on the first resin layer, dried at 75° C. for 10 minutes to completely evaporate the solvent and cooled to obtain a resin-coated copper foil having the second resin layer soluble in solvents and aqueous alkali solutions and high in flowability at heating.

An inner layer panel was prepared by forming conductor pattern at the given positions of a glass epoxy sheet having on each side a copper foil of 35 μm thick by selective etching and further providing thereon a nickel layer of 0.5 μm by electroless nickel plating. The above resin-coated copper foils were superposed on both sides of the inner layer panel and these were laminated by metal rolls of 500 mm in length and 55 mm in diameter at 75° C. under an air pressure of 2 kg/cm2. Since the second resin layer was high in flowability, the resin flowed between the conductor patterns and since the first resin layer had substantially no flowability, the first resin layer contacted with the conductor patterns of the inner layer. Thus, a copper-clad laminate panel having such construction was obtained.

An alakli-soluble type etching resist was formed by screen printing on the copper foil surface of the above copper-clad laminate panel excluding the portions where via holes 8 of 0.1 to 0.3 mmθ were to be formed in the copper foil and copper at the via hole portions of the copper foil was etched with ferric chloride solution. In subsequent removal of the film with 2 wt % aqueous sodium hydroxide solution, portions of the first layer at the via holes was also simultaneously dissolved and removed to expose the conductor patterns of the inner layer.

Successively, the panel was washed with water and 2% aqueous sulfuric acid solution, then inside of the blind holes was irradiated with irregularly reflected ultraviolet rays to cure the surface of resin layer in the blind holes, and thereafter silver paste C-100 manufactured by Toagosei Chemical Industry Co., Ltd. as a conductive paste was printed by stainless steel screen of 150 meshes. Then, the panel was predried at 100° C. for 30 minutes and thereafter, successively heated at 150° C. for 30 minutes and at 170° C. for 30 minutes to cure the silver paste, the first resin layer and the second resin layer.

Then, an etching resist was formed by photo method for forming desired patterns in the surface copper foil and unnecessary copper foil was removed by etching and the etching resist was removed to obtain a multilayer printed circuit board having blind holes.

EXAMPLE 13

To a mixture comprising 100 parts by weight of ethylcarbitol acetate and 100 parts by weight of novolak type epoxy acrylate having carboxyl group were added 80 parts by weight of urethane acrylate, 40 parts by weight of brominated polycarbonate oligomer, 5 parts by weight of active energy ray curing reaction initiator, 2 parts by weight of active energy ray curing reaction sensitizing agent, 100 paarts by weight of calined clay subjected to silane coupling treatment and containing 1 part by weight of Aerosil as a filler and 3.6 parts by weight of dicumyl peroxide as a curing agent. The resulting composition was coated at a thickness of 70 μm (after dried) on the roughened surface of a copper foil of 18 μm thick and dried at 75° C. for 10 minutes to evaporate the solvent, thereby forming the first resin layer soluble in solvents and aqueous alkali solutions and low in flowability even under heating.

A composition comprising 100 parts by weight of novolak type epoxy acrylate having carboxyl group, 100 parts by weight of ethylcarbitol acetate as a solvent, 40 parts by weight of brominated polycarbonate oligomer, 5 parts by weight of active energy ray curing reaction initiator, 2 parts by weight of active energy ray curing reaction sensitizing agent and 3.6 parts by weight of dicumyl peroxide as a curing agent was coated at a thickness of 30 μm (after dried) on the first resin layer, dried at 75° C. for 10 minutes to completely evaporate the solvent and cooled to obtain a resin-coated copper foil having the second resin layer soluble in solvents and aqueous alkali solutions and high in flowability at heating.

An inner layer panel was prepared by forming conductor patterns at the given positions of a glass epxoy laminate having on each side a copper foil of 35 μm thick by selective etching. The surface of the conductor patterns of inner layer panel was treated with a solution comprising 37 g/l of sodium chlorite, 10 g/l of sodium hydroxide and 20 g/l of trisodium phosphate 12 hydrate at 95° C. for 5 minutes, thoroughly washed with water and dried to perform blackening treatment.

Then, the resin-coated copper foil was superposed on both sides of the inner layer panel and these were laminate by metal rolls of 500 mm in length and 55 mm in diameter at 75° C. under an air pressure of 2 kg/cm2 at a speed of 0.4 m/min. Since the second resin layer was high in flowability, the resin flowed between the copper circuit patterns and since the first resin layer had substantially no flowability, the first resin layer contacted with the conductor patterns of the inner layer. Thus, a copper-clad laminate panel having such construction was obtained.

A positive type etching resist solution prepared by dissolving 31.1 parts by weight of cresol novolak resin and 3.5 parts by weight of o-naphthoquinonediazidosulfonic ester of cresol in a mixture comprising 43.6 parts by weight of ethylcellosolve acetate and 21.8 parts by weight of N,N-dimethylformamide was coated on the surface of copper foil of the above copper-clad laminate panel by spin coating and dried at 100° C. for 60 minutes to form a positive type etching resist 15 ( FIG. 20) at a thickness of 3 μm.

Figure 20:
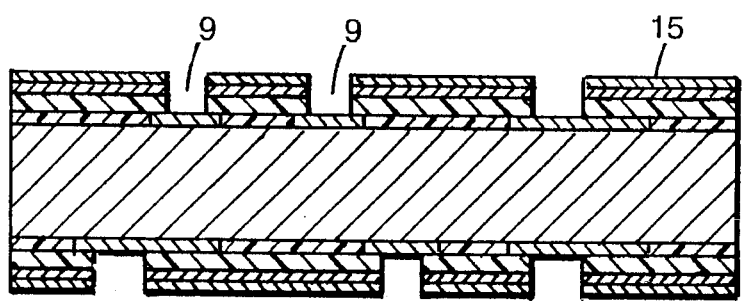
FIG. 20 is a schematic sectional view of copper-clad laminate panel after the first pattern was formed with positive type etching resist on the surface copper foil, then via holes were formed by etching and the resin layer under the via holes of copper foil was dissolved in Example 13.

Then, the resist was irradiated with 250 mJ/cm2 of ultraviolet rays from ultra-high pressure mercury lamp through a phototool and developed with 2.4% aqueous tetramethylammonium hydroxide solution to cure the portions other than via hole portions of 0.1 to 0.3 mm θ of copper foil. Then, copper of the via hole portions of the copper foil was etched with ferric chloride solution. Subsequently, the first resin layer under the via hole portions of copper foil was dissolved and removed with 2 wt % sodium carbonate solution to expose the conductor patterns of the inner layer to form blind holes. This state is shown in FIG. 20.

Figure 21:
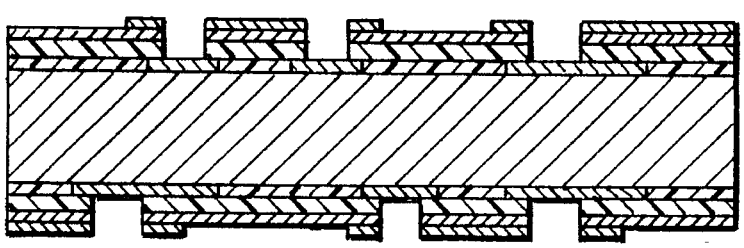
FIG. 21 is a schematic sectional view of the copper-clad laminate panel after the second pattern of positive type etching resist was formed in Example 13.

Successively, the panel was washed with water and 2% aqueous sulfuric acid solution and dried. Thereafter, the surface of the outer layer excluding the desired second pattern portion was exposed by irradiation with 400 mJ/cm2 of irregularly reflected ultraviolet rays and developed. In this case, simultaneously the resin layer in the blind holes was irradiated with the ultraviolet rays to cure the surface portion of the resin layer. This state is shown in FIG. 21.

Figure 22:
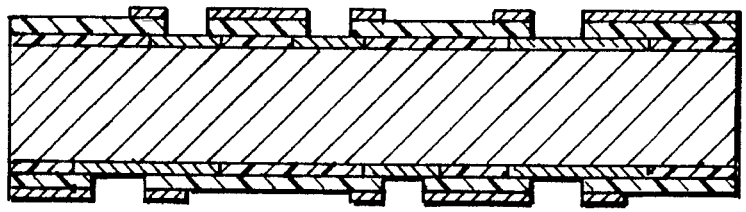
FIG. 22 is a schematic sectional view of the copper-clad laminate panel after unnecessary copper foil on the outer layer was etched and the positive type etching resist was removed in Example 13.

Then, unnecessary portion of the exposed outer layer copper foil was removed by etching with ferric chloride solution and again irradiation with ultraviolet rays was conducted to half-cure the exposed resin layer and the etching resist was removed with 2% sodium hydroxide. This state is shown in FIG. 22.

Figure 23:
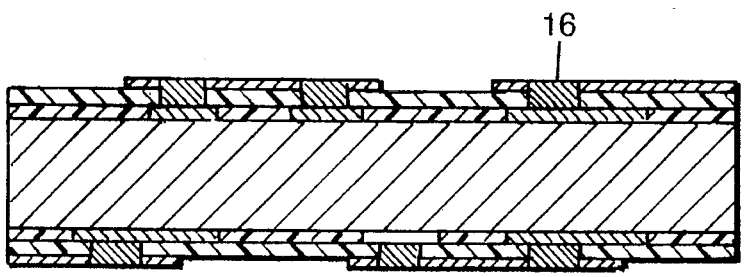
FIG. 23 is a schematic sectional view of the copper-clad laminate panel after conductive paste was coated in Example 13.

Then, silver paste C-100 manufactured by Toagosei Chemical Industry Co., Ltd. as a conductive paste 16 was printed at a thickness of 25 μm by stainless steel screen of 150 meshes. Then, the panel was predried at 100° C. for 30 minutes and thereafter, successively heated at 150° C. for 30 minutes and at 170° C. for 30 minutes to completely cure the silver paste, the first resin layer and the second resin layer, to obtain a panel having blind holes where the conductor pattern on the inner layer panel and the surface copper pattern were electrically connected. This state is shown in FIG. 23.

As explained above, according to the present invention, blind holes can be formed collectively by etching of copper foil and dissolution of resin and so, productivity can be sharply improved as compared with conventional methods of formation of blind holes which include many steps, such as pressing steps and drilling steps in which the blind holes are made one by one. Furthermore, irrespective of presence of unevenness in depth of pattern of inner layer panel, holes for blind holes can be surely provided by dissolving resin layer until the copper foil pattern of inner layer panel is exposed and thus, failure in connection of blind via holes become few and besides, there occurs few failure of shorting caused by incorrect connection with copper foil pattern of other layers. In addition, since no prepreg may be used or amount of the prepreg can be diminished which is used between inner layer panel and outer copper foil, thickness of printed circuit board can be reduced and hence, high density multilayer printed circuit boards can be obtained. Accordingly, the method of the present invention is very useful for making multilayer printed circuit boards having a blind via hole, which are excellent in physical properties, electrical properties and reliability and are used for high density assembly in various electronic equipments.

What is claimed is:

1. A method for making a multilayer printed circuit board having blind holes, which comprises laminating a copper foil and an inner layer panel together by means of an uncured resin layer under heating, said inner panel being a copper-clad laminate having circuit patterns on one or both sides thereof, said resin layer being soluble in an aqueous alkali solution and having a flowability upon heating; forming via holes in the surface of the copper foil by etching; and then dissolving and removing the resin layer under said via holes with an aqueous alkali solution thereby selectively removing the resin and forming blind holes in which the copper foil of the inner layer panel is exposed and thereafter curing the remaining resin layer; and electrically interconnecting the copper foil through the blind holes by conductive plating or conductive paste.

2. A method according to claim 1, wherein said copper foil has a roughened surface, said roughened surface being coated with the said resin layer which is soluble in an aqueous solution and has flowability upon heating.

3. A method according to claim 1, wherein after the blind holes in which the copper surface of the inner layer panel is exposed are formed, the blind holes are further washed with acid.

4. A method according to claim 1, wherein the resin layer soluble in an aqueous alkali solution and having flowability upon heating comprises a resin mainly composed of a novolak epoxy acrylate or methacrylate having carboxyl group.

5. A method according to claim 1, wherein the resin layer soluble in an aqueous alkali solution and having flowability upon heating has a two-layer structure comprising a first resin layer having low flowability upon heating and a second resin layer having high flowability upon heating compared to the first layer.

6. A method according to claim 1, wherein the resin layer soluble in an aqueous alkali solution and having flowability upon heating comprises 100 parts by weight of a novolak type epoxy acrylate or methacrylate having carboxyl group, 20 to 200 parts by weight of a filler and 1 to 10 parts by weight of a curing agent.

7. A method according to claim 1, wherein the resin layer soluble in an aqueous alkali solution and having flowability upon heating comprises 100 parts by weight of a novolak epoxy acrylate or methacrylate having carboxyl group, 0.5 to 10 parts by weight of an active energy ray curing reaction initiator, 0.5 to 10 parts by weight of an active energy ray curing reaction sensitizer, 20 to 200 parts by weight of a filler and 1 to 10 parts by weight of a curing agent.

8. A method according to claim 6 or 7, which additionally comprises 20 to 120 parts by weight of urethane acrylate.

9. A method according to claim 6 or 7, which additionally comprises 20 to 60 parts by weight of a brominated carbonate oligomer.

* * * * *